(12) United States Patent
Smith et al.

(10) Patent No.: US 11,764,113 B2
(45) Date of Patent: Sep. 19, 2023

(54) METHOD OF 3D LOGIC FABRICATION TO SEQUENTIALLY DECREASE PROCESSING TEMPERATURE AND MAINTAIN MATERIAL THERMAL THRESHOLDS

(71) Applicant: Tokyo Electron Limited, Tokyo (JP)

(72) Inventors: Jeffrey Smith, Clifton Park, NY (US); Daniel Chanemougame, Niskayuna, NY (US); Lars Liebmann, Mechanicsville, NY (US); Paul Gutwin, Albany, NY (US); Robert Clark, Livermore, CA (US); Anton Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/392,997

(22) Filed: Aug. 3, 2021

(65) Prior Publication Data
US 2022/0122892 A1 Apr. 21, 2022

Related U.S. Application Data

(60) Provisional application No. 63/094,344, filed on Oct. 20, 2020.

(51) Int. Cl.
*H01L 21/8238* (2006.01)
*H01L 23/00* (2006.01)
(Continued)

(52) U.S. Cl.
CPC .... *H01L 21/823807* (2013.01); *H01L 21/306* (2013.01); *H01L 21/324* (2013.01); *H01L 24/83* (2013.01); *H01L 2224/83896* (2013.01)

(58) Field of Classification Search
CPC ..... H01L 2221/68304–68395; H01L 21/8238; H01L 21/823828; H01L 21/82385; H01L 21/823871; H01L 21/8221
See application file for complete search history.

(56) References Cited

U.S. PATENT DOCUMENTS

| 6,413,802 B1 | 7/2002 | Hu et al. |
| 7,560,361 B2 | 7/2009 | Frank et al. |
| (Continued) | | |

FOREIGN PATENT DOCUMENTS

| CN | 111383996 A | 7/2020 |
| WO | 2018/063226 A1 | 4/2018 |
| (Continued) | | |

OTHER PUBLICATIONS

International Search Report and Written Opinion dated Dec. 23, 2021 in PCT/US2021/048491, 10 pages.

*Primary Examiner* — Julio J Maldonado
*Assistant Examiner* — Stanetta D Isaac
(74) *Attorney, Agent, or Firm* — Oblon, McClelland, Maier & Neustadt, L.L.P.

(57) ABSTRACT

Techniques herein include methods for fabricating CFET devices. The methods enable high-temperature processes to be performed for FINFET and gate all around (GAA) technologies without degradation of temperature sensitive materials within the device and transistors. In particular, high temperature anneals and depositions can be performed prior to deposition of temperature-sensitive materials, such as work function metals and silicides. The methods enable at least two transistor devices to be fabricated in a stepwise manner while preventing thermal violations of any materials in either transistor.

20 Claims, 29 Drawing Sheets

(51) Int. Cl.
    *H01L 21/324*     (2006.01)
    *H01L 21/306*     (2006.01)

(56) References Cited

U.S. PATENT DOCUMENTS

| | | |
|---|---|---|
| 9,406,748 B1 | 8/2016 | Balakrishnan et al. |
| 10,636,791 B1 | 4/2020 | Rubin |
| 10,700,067 B2 | 6/2020 | Rubin |
| 10,770,460 B2 | 9/2020 | Rubin |
| 2006/0035450 A1 | 2/2006 | Frank et al. |
| 2014/0137930 A1 | 5/2014 | Derkacs et al. |
| 2017/0148923 A1 | 5/2017 | Balakrishnan et al. |
| 2018/0233409 A1 | 8/2018 | Son et al. |
| 2018/0248005 A1 | 8/2018 | Lilak et al. |
| 2018/0315838 A1 | 11/2018 | Morrow et al. |
| 2020/0119011 A1 | 4/2020 | Rubin |
| 2020/0119012 A1 | 4/2020 | Rubin |
| 2020/0152629 A1 | 5/2020 | Rubin |
| 2020/0212038 A1 | 7/2020 | Rachmady et al. |

FOREIGN PATENT DOCUMENTS

| | | |
|---|---|---|
| WO | 2018/063278 A1 | 4/2018 |
| WO | 2018/063302 A1 | 4/2018 |
| WO | 2018/182615 A1 | 10/2018 |
| WO | 2018/182655 A1 | 10/2018 |

BACKGROUND

BACKGROUND

| 2D IMENSIONAL CFET | SEQUENTIAL CFET | THIS DISCLOSURE |
|---|---|---|
| PMOS / NMOS Nanosheet formation | PMOS Nanosheet formation | Epi Stack Wafer Bonding |
| Buried power (optional) | Buried power (optional) | PMOS Nanosheet formation |
| PMOS / NMOS Dummy gate formation | PMOS Inner spacer formation | PMOS Inner spacer formation |
| PMOS / NMOS Inner spacer formation | PMOS Contact formation | PMOS Contact formation |
| PMOS Contact formation | PMOS RMG HK / cap | Wafer Bond / Flip |
| NMOS Contact formation | Reliability anneal | NMOS Nanosheet formation |
| PMOS / NMOS RMG HK / cap | PMOS RMG finish | NMOS Dummy gate formation |
| Reliability anneal | PMOS Silicide / Interconnect / VBPR | NMOS Inner spacer formation |
| PMOS RMG finish | Epi Stack Wafer Bonding | NMOS Contact formation |
| NMOS RMG finish | NMOS Nanosheet formation | NMOS RMG HK / cap |
| PMOS Silicide / Interconnect / VBPR | NMOS Dummy gate formation | Wafer Bond / Flip |
| NMOS silicide / Interconnect / VBPR | NMOS Inner spacer formation | PMOS RMG HK / cap |
| M0 / via-to-gate / via-to-contact | NMOS Contact formation | Reliability anneal |
| | NMOS RMG HK / cap | PMOS RMG finish |
| | Reliability anneal | Wafer Bond / Flip |
| | NMOS RMG finish | NMOS RMG finish |
| | NMOS / PMOS Inter-gate via | NMOS / PMOS Inter-gate via |
| | NMOS silicide / interconnect | NMOS silicide / interconnect |
| | NMOS / PMOS Inter-interconnect via | Wafer Bond / Flip |
| | M0 / via-to-gate / via-to-contact | NMOS / PMOS Inter-interconnect via |
| | | PMOS Silicide / Interconnect |
| | | Buried power and VBPR (optional) |
| | | Wafer Bond / Flip |
| | | M0 / via-to-gate / via-to-contact |

FIG. 3

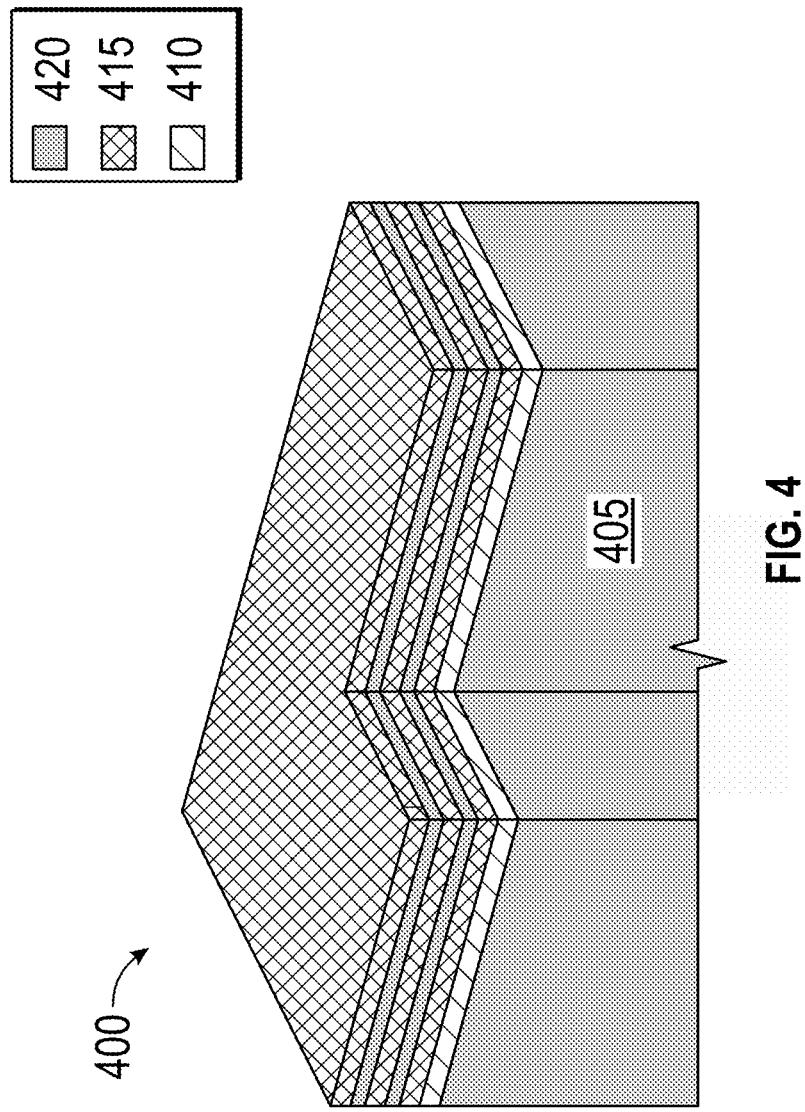

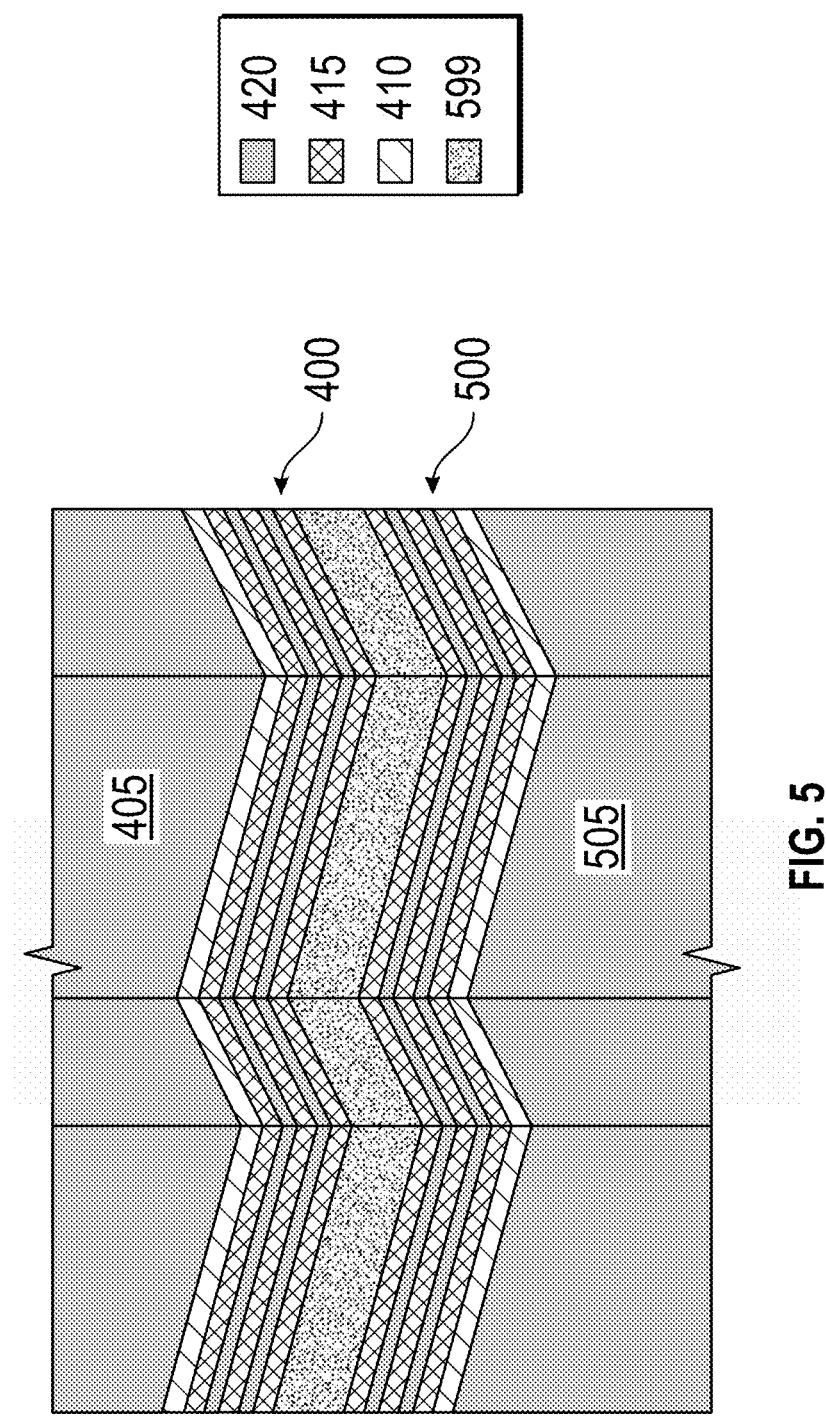

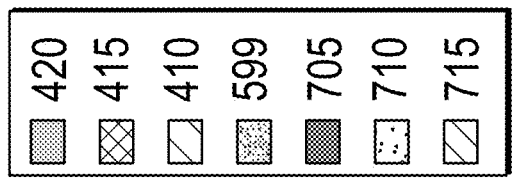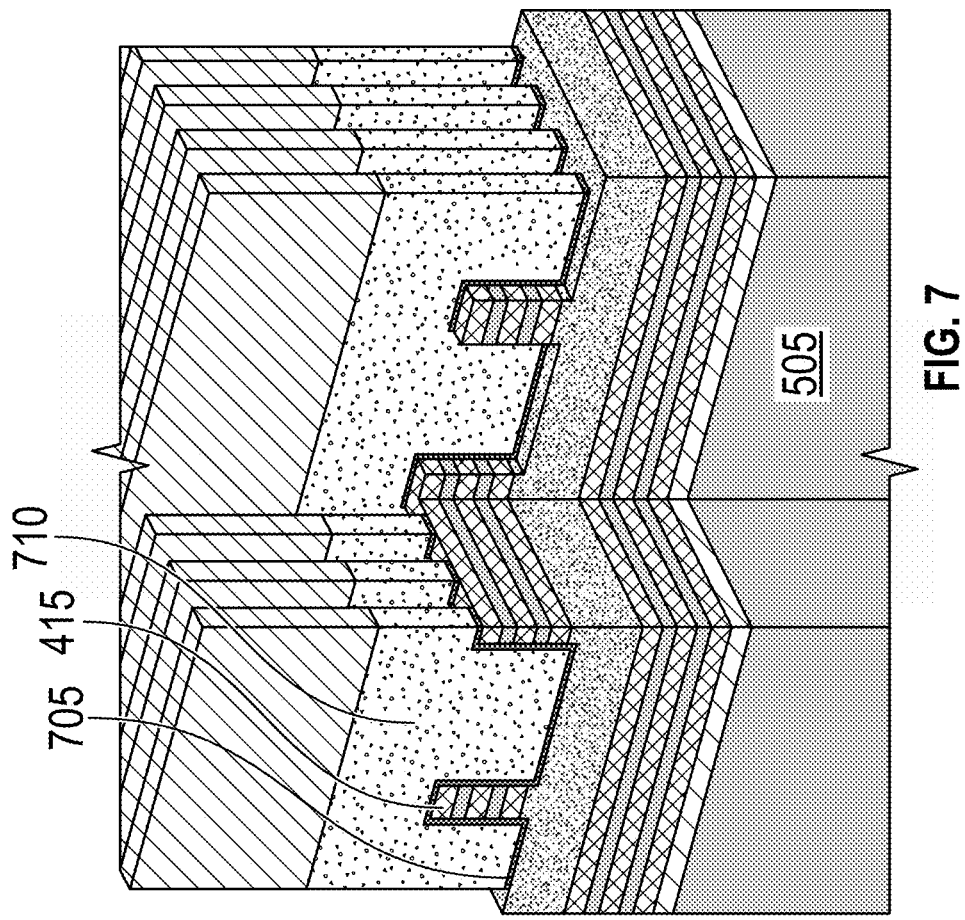
FIG. 7

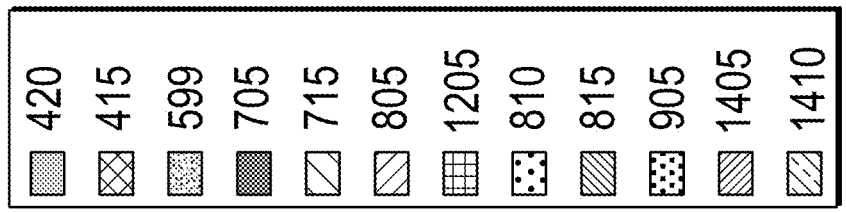
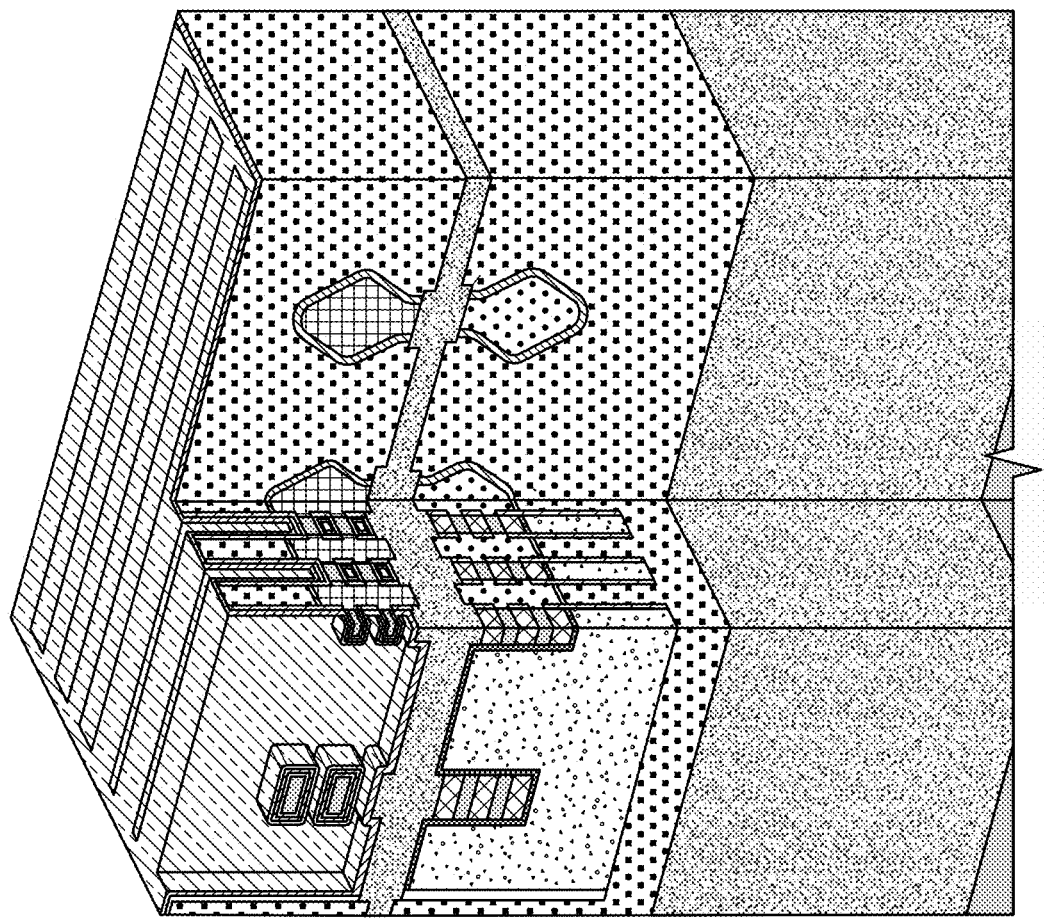
FIG. 14

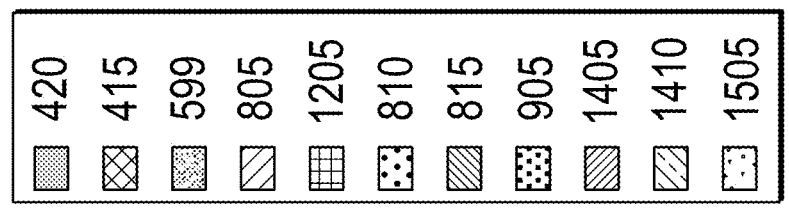
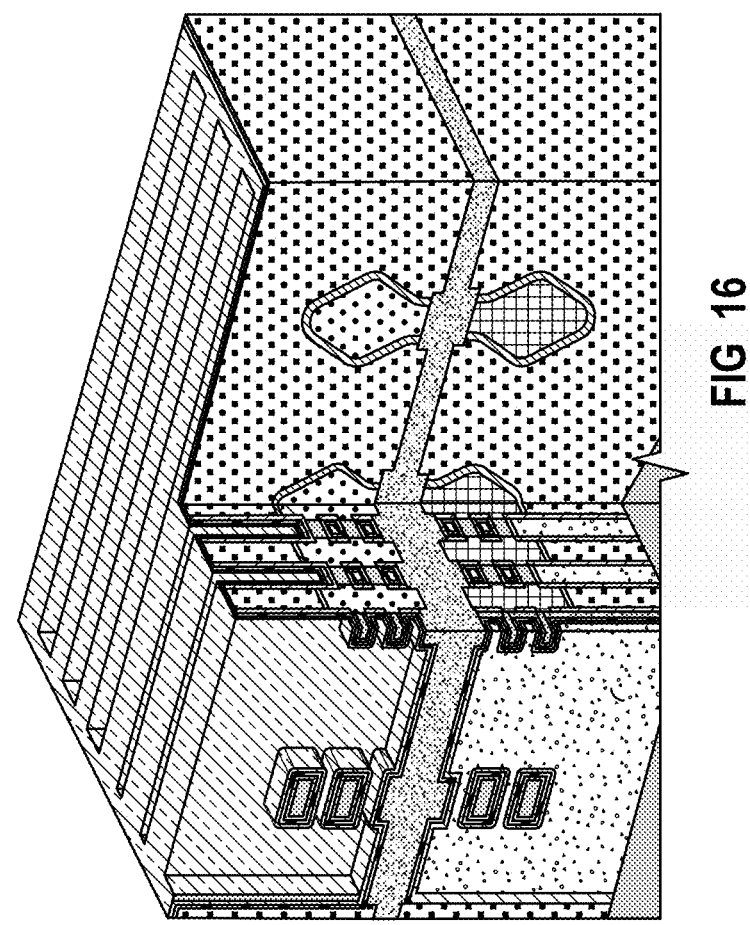
FIG 16

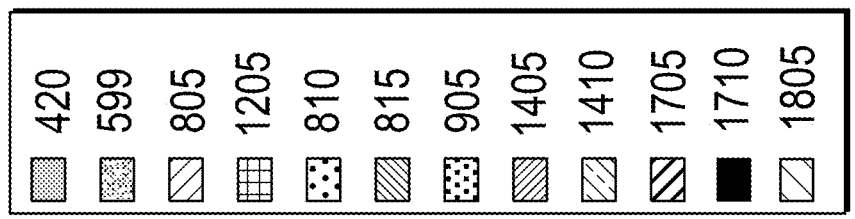
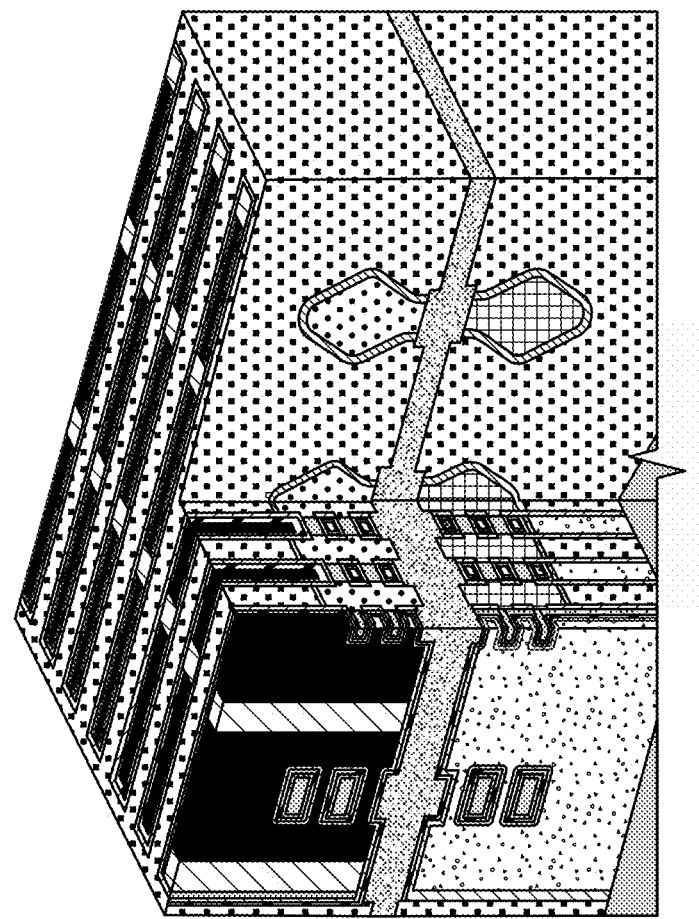
FIG 18

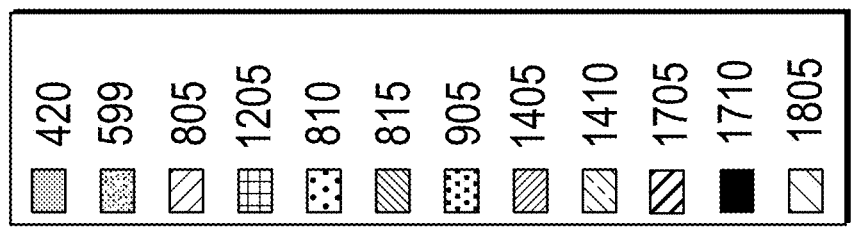
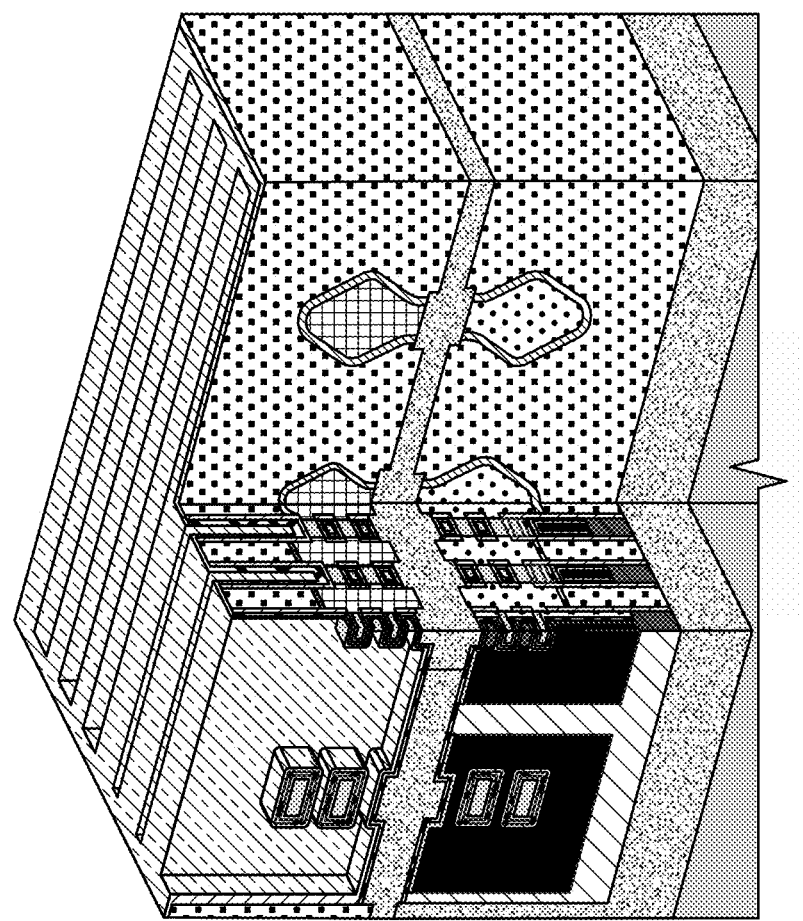
FIG. 21

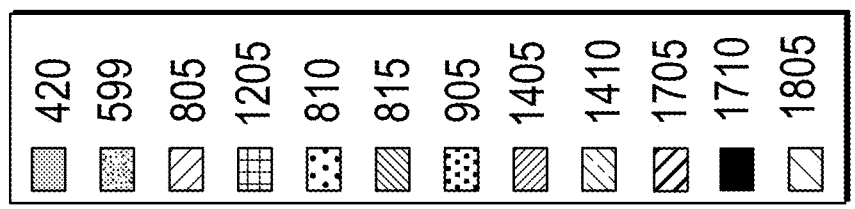
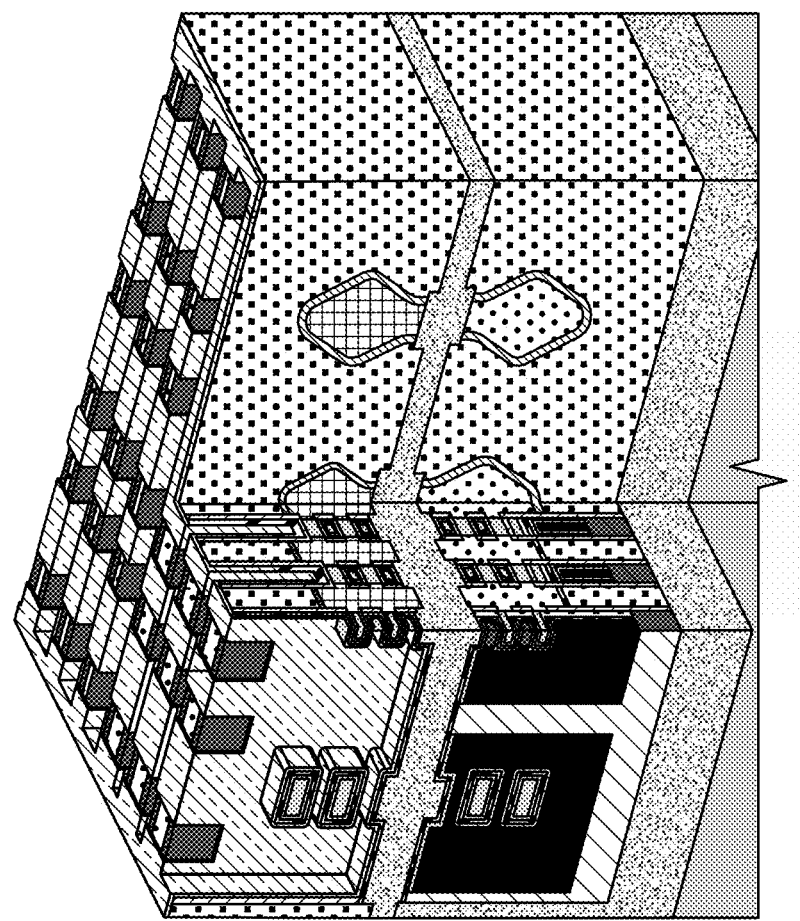
FIG. 22

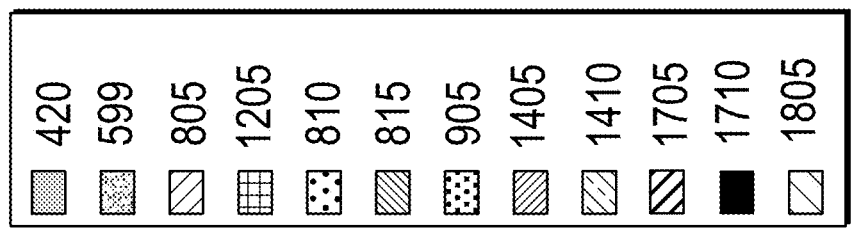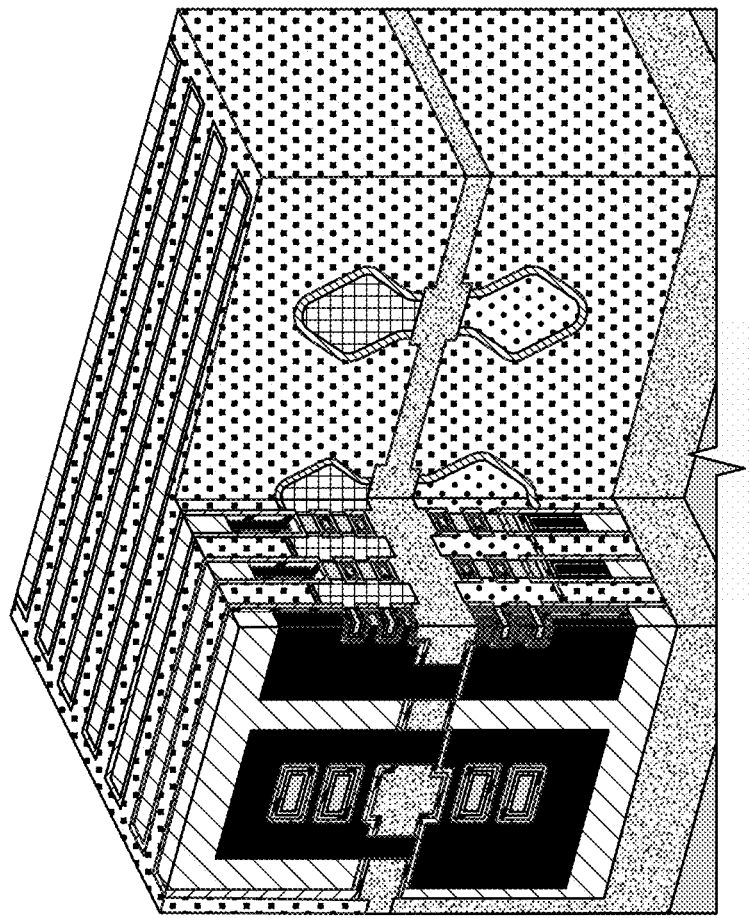
FIG. 23

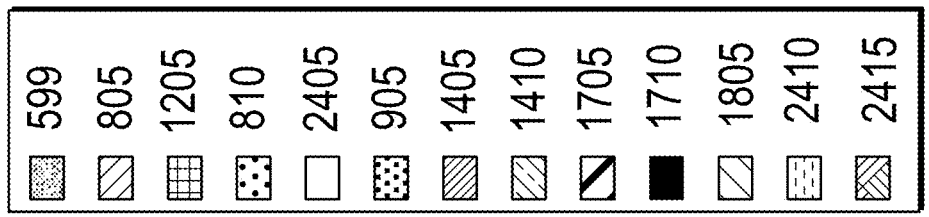
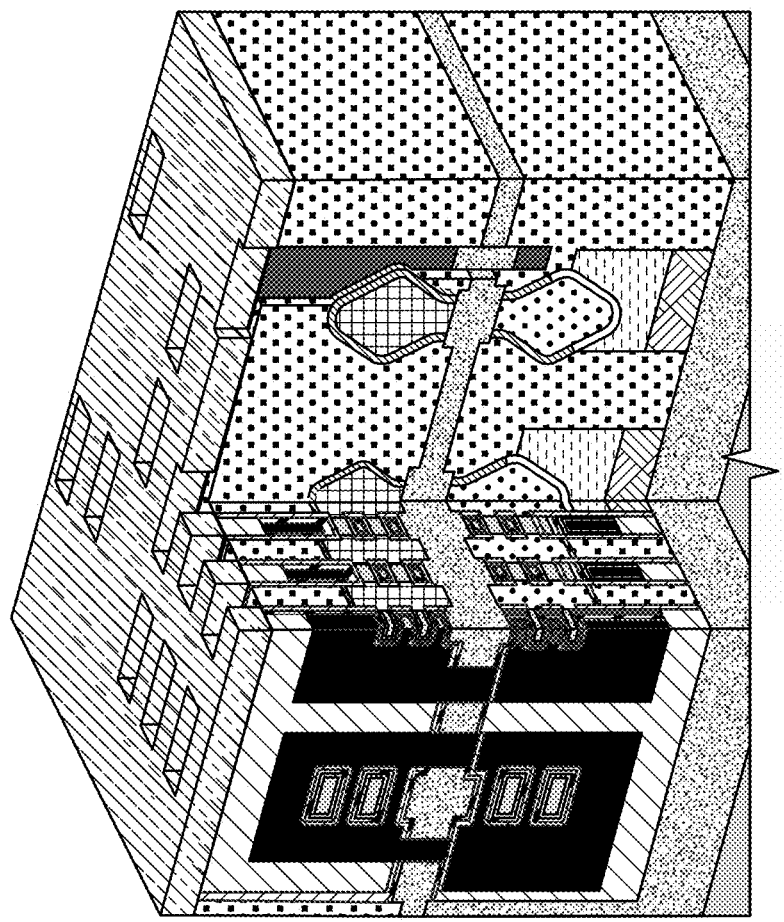
FIG. 25

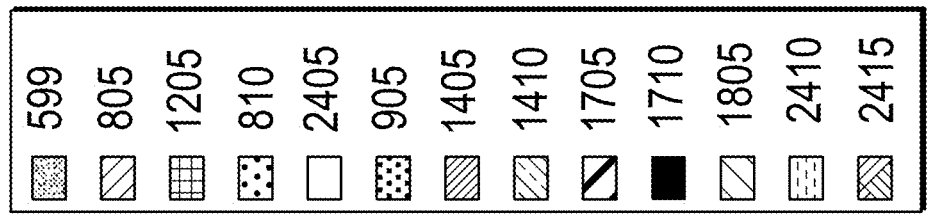
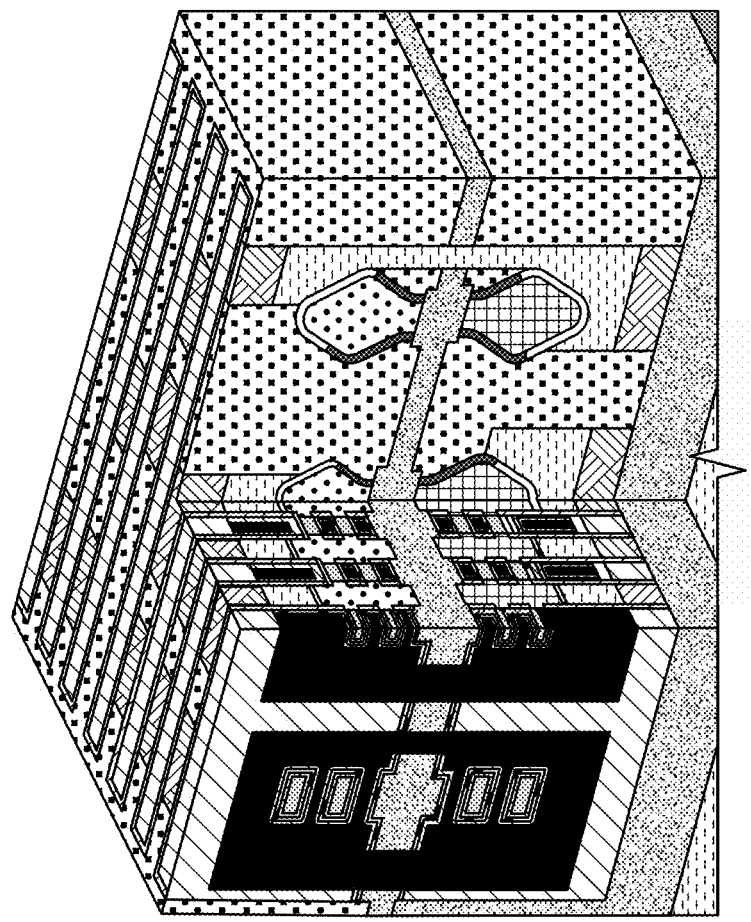
FIG. 26

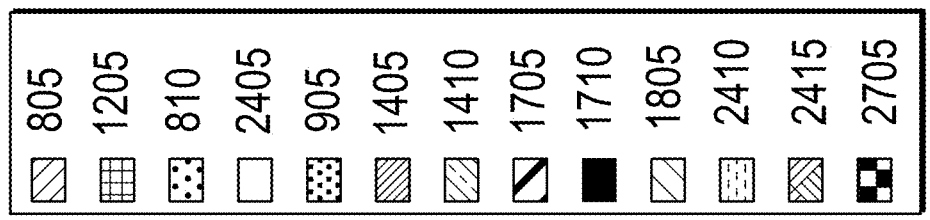
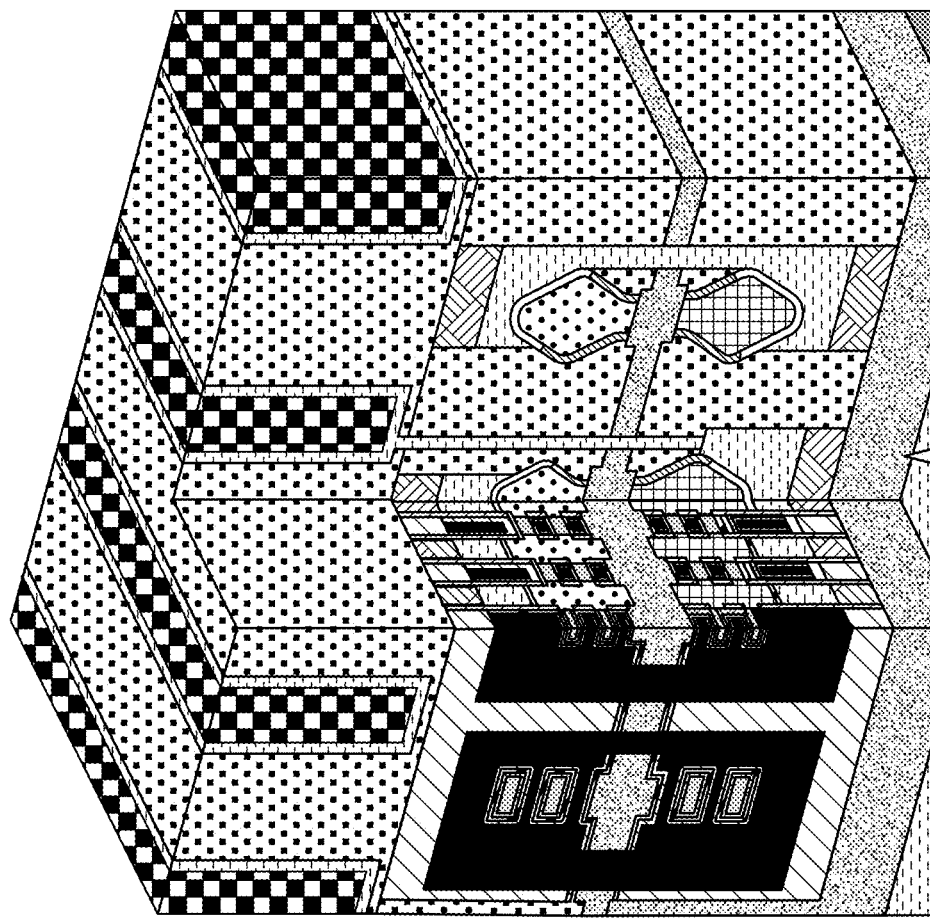
FIG. 27

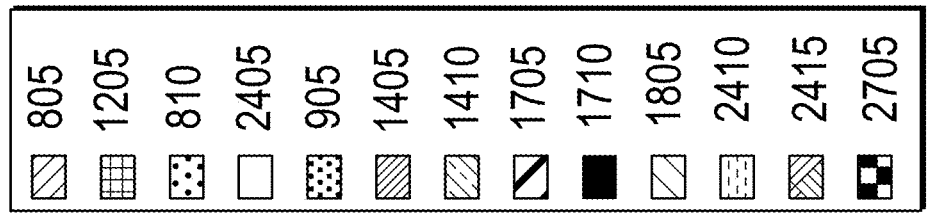
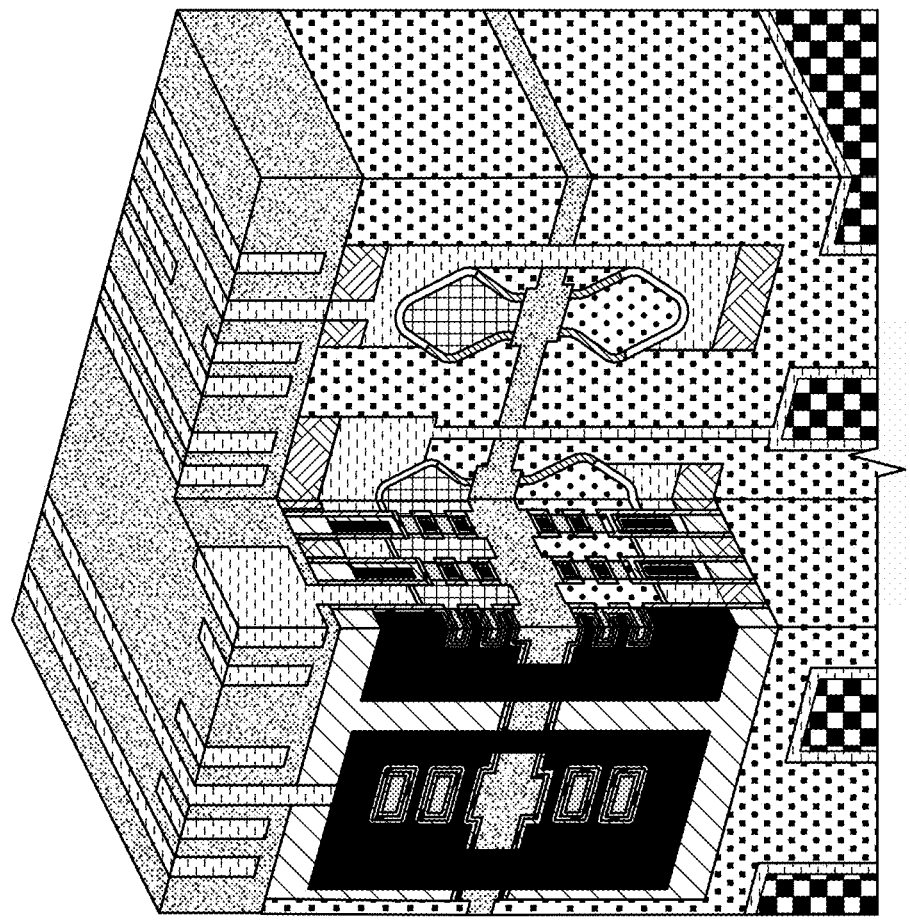
FIG. 28

US 11,764,113 B2

METHOD OF 3D LOGIC FABRICATION TO SEQUENTIALLY DECREASE PROCESSING TEMPERATURE AND MAINTAIN MATERIAL THERMAL THRESHOLDS

CROSS REFERENCE TO RELATED APPLICATIONS

This present disclosure claims the benefit of U.S. Provisional Application No. 63/094,344, filed on Oct. 20, 2020, which is incorporated herein by reference in its entirety.

FIELD OF THE INVENTION

The present disclosure relates to microelectronic devices including semiconductor devices, transistors, and integrated circuits, including methods of microfabrication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome these scaling limitations by increasing transistor density in volume rather than area. Although device stacking has been successfully demonstrated and implemented by the flash memory industry with the adoption of 3D NAND, application to random logic designs is more difficult. Thus, 3D integration for logic chips (e.g. CPU (central processing unit), GPU (graphics processing unit), FPGA (field programmable gate array), and SoC (system on a chip)) is desired.

SUMMARY

The present disclosure relates to a method of forming a semiconductor device, including forming a first layer stack on a first wafer; forming a second layer stack on a second wafer; attaching the first wafer to the second wafer via a bonding layer disposed between the first layer stack and the second layer stack; uncovering the first layer stack, the first layer stack being uncovered along an uncovered side opposite a bonded side of the first layer stack, the bonded side of the first layer stack being proximal to the bonding layer; forming, at least partially, a first transistor device from the first layer stack; attaching a first carrier wafer to the uncovered side of the first layer stack; uncovering the second layer stack; forming, at least partially, a second transistor device from the second layer stack; and performing a first thermal process on the first transistor device and the second transistor device.

The present disclosure additionally relates to a method of fabricating a CFET device, including forming a first layer stack on a first wafer; forming a second layer stack on a second wafer; attaching the first wafer to the second wafer via a bonding layer disposed between the first layer stack and the second layer stack; stepwise accessing each layer stack from each respective side to partially form transistor devices; and performing a first thermal process on the partially formed transistor devices.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 3 shows a table comparing a 2-dimensional (2D) GAA flow to a sequential CFET flow and also to techniques described herein, according to an embodiment of the present disclosure.

FIG. 4 is a cross-sectional substrate segment including deposited layers, according to an embodiment of the present disclosure.

FIG. 5 is a cross-sectional substrate segment of two layer stacks bonded, according to an embodiment of the present disclosure.

FIG. 7 is a cross-sectional substrate segment including a dummy gate, according to an embodiment of the present disclosure.

FIG. 14 is a cross-sectional substrate segment of the second layer stack with the amorphous silicon removed, according to an embodiment of the present disclosure.

FIG. 16 is a cross-sectional substrate segment of the first layer stack exposed after removing the carrier wafer, according to an embodiment of the present disclosure.

FIG. 18 is a cross-sectional substrate segment of the first layer stack with gate cutting, according to an embodiment of the present disclosure.

FIG. 21 is a cross-sectional substrate segment of the second layer stack uncovered, according to an embodiment of the present disclosure.

FIG. 22 is a cross-sectional substrate segment of the second layer stack with common gates formed, according to an embodiment of the present disclosure.

FIG. 23 is a cross-sectional substrate segment of the second layer stack including the RMG metal fill and the SiN cap, according to an embodiment of the present disclosure.

FIG. 25 is a cross-sectional substrate segment of the first layer stack including a hardmask, according to an embodiment of the present disclosure.

FIG. 26 is a cross-sectional substrate segment of the first layer stack including a PMOS interconnect, according to an embodiment of the present disclosure.

FIG. 27 is a cross-sectional substrate segment of the first layer stack and the second layer stack including buried power rails, according to an embodiment of the present disclosure.

FIG. 28 is a cross-sectional substrate segment of the first layer stack and the second layer stack including connections to gates and contacts, according to an embodiment of the present disclosure.

DETAILED DESCRIPTION

Figure 1:
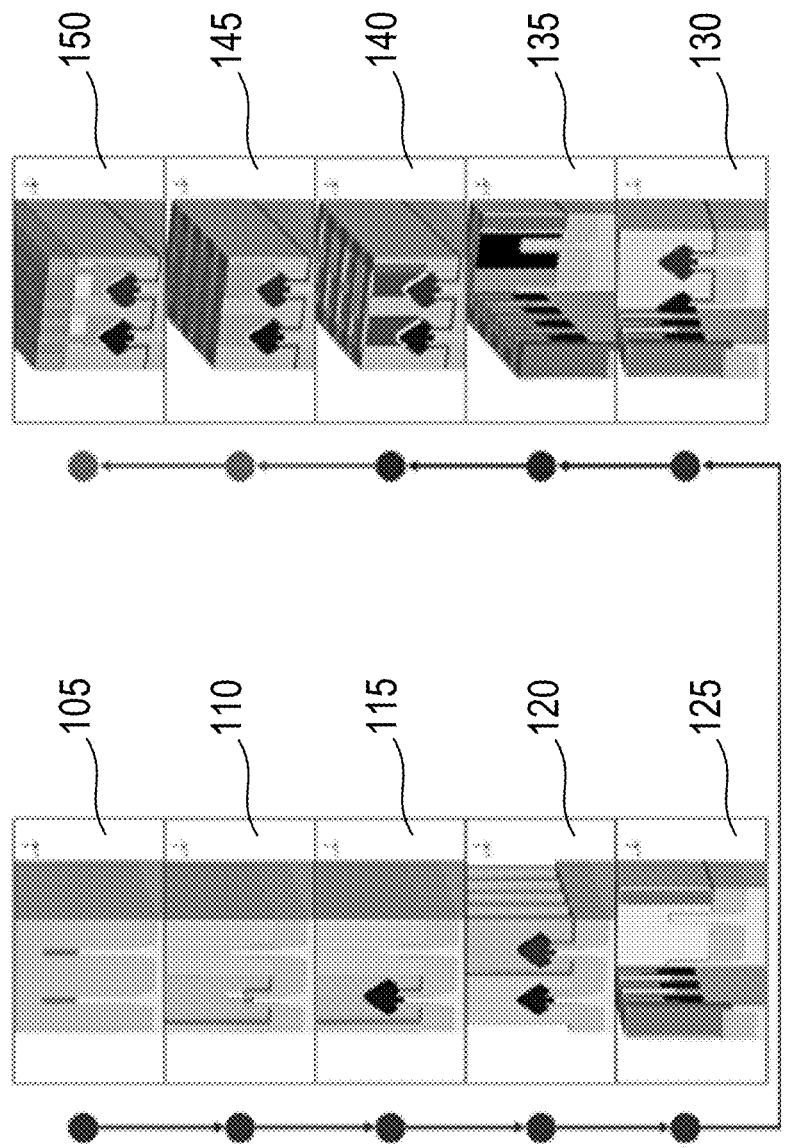
FIG. 1 shows an example of thermal processing steps for fin field-effect transistor (FINFET) logic devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include methods for fabrication of a complementary FET (CFET) device in which all high-temperature processes commonly used for conventional FINFET and gate all around (GAA) technologies can be incorporated including without degradation of temperature sensitive materials within the device and transistors. Techniques herein disclose process integration methods as well as several hardware solutions that enable a functioning, high-volume process for CFET devices while using conventional high-temperature unit processes. This is achieved through the incorporation of multiple wafer bonding to carrier wafers and wafer flips to allow access to the CFET backside so that a FINFET or GAA like process flow can be incorporated into a CFET device. For example, two wafers with epitaxial stacks of layers are bonded prior to lithography steps to define transistor shapes.

Complementary FET (CFET) logic and SRAM devices are comprised of standard cells in which each complementary pair of devices and transistors are vertically stacked overtop of one another as opposed to being in a side-by-side configuration. The side-by-side configuration is conventionally used to produce logic cells for FINFET or gate-all-around (GAA) technologies. Complementary FET devices have a number of significant benefits over existing logic designs as a result of the PMOS/NMOS spacing. Such spacing has been a significant limiter to area scaling of logic devices. With CFET, however, scaling can be accomplished vertically, which allows for very aggressive scaling of logic devices. Sharing of NMOS and PMOS outputs to a common signal track can now be accomplished through staggering of the bottom-tier and upper-tier interconnects to provide this access. Whereas for conventional logic designs this requires routing to additional metal levels and provides a point of congestion as standard cells scale down to five signal tracks or even lower to achieve theoretical performance benefits resulting from the shorter wiring distances.

Integrating such devices have been challenging because CFET process flow deviate significantly from that of a conventional two-dimension FINFET or GAA integration. For FINFET and GAA technology, the integration flow has evolved in order to complete all high-temperature processing in the front-end of the line (FEOL) before any thermally sensitive materials such as work function metals and silicides are incorporated into the device. The incorporation of the replacement metal gate technique enables deposition of temperature sensitive work function metals after high-temperature processing. With replacement metal gate, a dummy gate comprised of either polysilicon or amorphous silicon is in place during high temperature processing such in-situ doped epitaxy growth processes as a place holder, to be removed and replace with metal after completion of high-temperature processing. Other processes have also been substituted with short duration thermal processing such as sub-millisecond and even sub-microsecond laser anneals so that S/D activation can be achieved without diffusion of the dopant species prior to activation within the source and drain lattice. Such a "thermal flow" for an example logic FINFET fabrication is shown in FIG. 1.

FIG. 1 shows an example of thermal processing steps for fin field-effect transistor (FINFET) logic devices. As shown, high-temperature processes can be executed ahead of the formation of silicides on source and drain contacts and deposition of work function metals within a high-k metal gate. A number of the high temperature processes, such as shallow trench isolation (STI) anneal, silicon pre-cleaning and epitaxy growth, and high-k reliability anneals, are completed prior to the deposition of work function metals within the HKMG structure and the formation of silicides in the contact/interconnect module. A structure at step 105 shows an STI anneal, for example, at 1000° C. The structure at step 110 shows a Si pre-clean at, for example, 750° C. to 800° C. The structure at step 115 shows formation of a source/drain for an NMOS device at, for example, 600° C. to 700° C. The structure at step 120 shows formation of a source/drain for a PMOS device at, for example, 525° C. to 650° C. The structure at step 125 shows a reliability anneal at, for example, 700° C. to 780° C. The structure at step 130 shows activation of the source/drains for the NMOS and PMOS devices at, for example, 800° C. to 1,100° C. The structure at step 135 shows depositions of work function metals. The structure at step 140 shows silicide formation. The structure at step 145 shows interconnect post-metallization anneal at, for example, 450° C. The structure at step 150 shows metallization.

This temperature-based integration flow, however, is challenging to implement with 3D devices, that is, architectures with vertical stacks of field-effect transistors. Two important changes to CMOS device manufacturing are changing the thermal management processing flow. One change includes a use of wrap-around contacts (WAC) in which silicide is formed over as much of the source and drain contact surface area as possible, as well as the interconnect metal. The purpose is to drive down contact resistance as a mechanism to boost the overall power/performance/area (PPA) metric of the device. A second change includes the introduction of 3D logic architectures such as transistor-on-transistor stacking or gate-on-gate stacking. The 3D stacking can be executed, for example, using complimentary field effect transistor (CFET) types of devices. Formation of stacked devices can be realized either with monolithic stacking (single wafer) or heterogeneous stacking (wafer on wafer).

Figure 2:
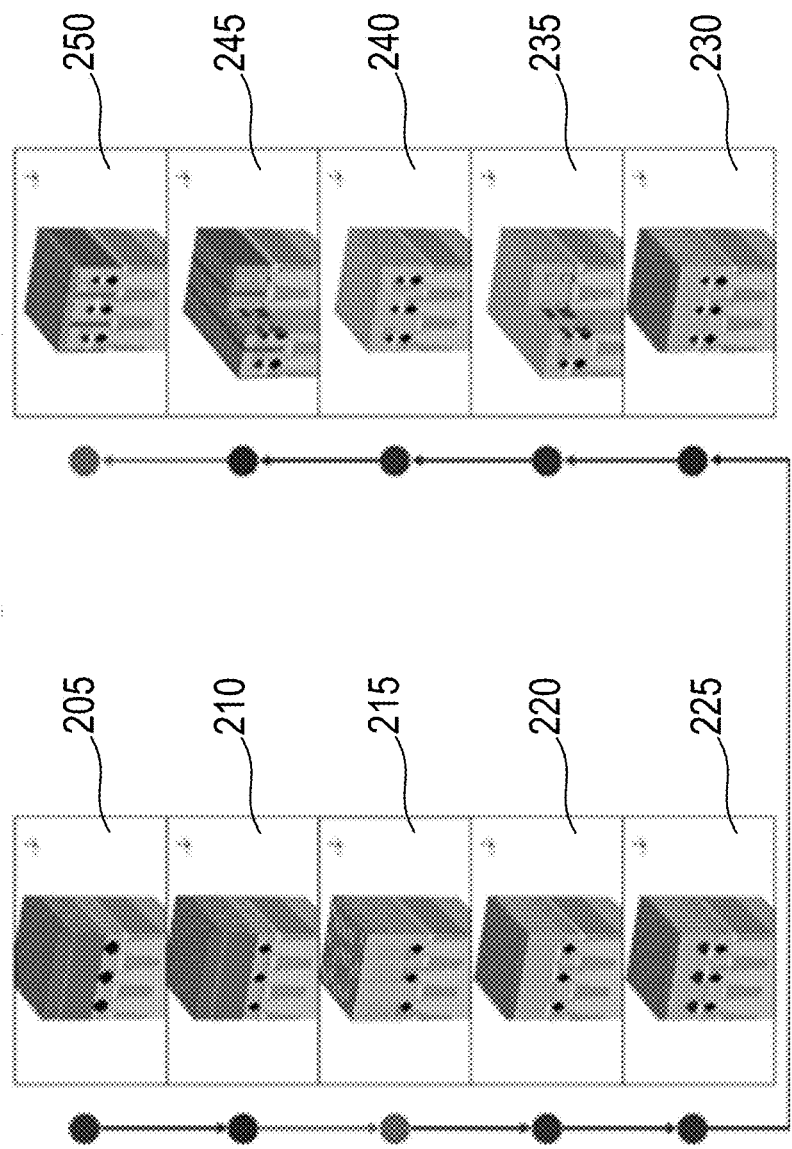
FIG. 2 shows an example of a CFET type of process flow for device-on-device stacking.

For monolithic integrations, the integration flow is shown in FIG. 2. FIG. 2 shows an example of a CFET type of process flow for device-on-device stacking. As shown, the devices are formed first for the lower tier device, then the upper tier device, and then high-k metal gate processing. Thus, high temperature processes are done both before and after the deposition of thermally-sensitive materials. Notably, a bottom device interconnect will be fully formed, wherein a temperature sensitive silicide is formed in a lower tier interconnect structure before additional high-temperature processes are performed for the subsequent devices that will be formed above a corresponding device. A fully-formed bottom interconnect can introduce processing challenges, such as maintaining a level of thermal control for the subsequent processing to prevent damage to the sensitive metals or silicide formed in the completed bottom-tier devices. A structure at step 205 shows formation of a source/drain for a NMOS device at, for example, 600° C. to 700° C. The structure at step 210 shows NMOS silicide formation. The structure at step 215 shows a post-metallization anneal at, for example, 450° C. to 650° C. The structure at step 220 shows a Si pre-clean at, for example, 750° C. to 800° C. The structure at step 225 shows formation of a source/drain for a PMOS device at, for example, 550° C. to 650° C. The structure at step 230 shows PMOS silicide formation. The structure at step 235 shows a reliability anneal at, for example, 700° C. to 780° C. The structure at step 240 shows activation of the source/drains for the NOMS and PMOS devices at, for example, 800° C. to 1,100° C. The structure at step 245 shows work function metal deposition. The structure at step 250 shows a post-metallization anneal at, for example, 450° C.

For the case of monolithically formed CFET devices outlined above, the formation and silicidation of the contacts and subsequent metallization of the lower tier and upper tier devices is performed prior to the high-k metal gate (HKMG) process so the silicide on the lower tier devices will experience the thermal processing associated with forming the upper device structure as well as the reliability anneals within the HKMG process. For heterogeneous CFET devices, the process is similar with the exception that the bottom device will likewise have a bottom transistor formed prior to the formation of the upper device and transistor. Both integrations of a CFET device will have the same fundamental thermal limitations.

This challenge is exacerbated by having multiple CFET structures stacked on top of one another to form multiple planes of logic devices for future CMOS scaling. As with the case of CFET devices, the WAC will often require that the formation of the silicide around the source and drain contact be formed prior to any high temperature processing done within the HKMG process. Unlike CFET devices, however, the interconnect for a FINFET based device using wrap-around contact will not have any interconnect metallization done. Nevertheless, the silicide is a thermally sensitive material which can undergo phase change or agglomeration associated with the higher temperature processes and thus still poses a challenge.

The thermal challenge with this approach has been the formation of the silicides and lower tier interconnect prior to the epitaxy growth of the upper contact which is typically done at temperatures exceeding 700° C. when materials such as phosphorous-doped silicon are used for NMOS contacts and boron-doped silicon germanium are used for PMOS contacts, as is done in some high volume manufacturing. Reducing the temperature of the in-situ doped epitaxy contacts can be challenging given the dopant loading is directly related to the temperature at which the epitaxy is grown. At temperatures below 550° C., which is generally understood to be the maximum steady-state temperature limit for many of the work function metals and silicides used, the maximum in-situ doping concentrations could be off by as much as an order of magnitude (1E20 atoms/cm$^2$ concentrations versus 1E21 atoms/cm$^2$), which in turn increases contact resistance by an order of magnitude (from 1e-9 ohm cm$^2$ up to 1 e-8 ohm cm$^2$) which in turn can cause between 5 to 10% increase in stage delay of the device, thus offsetting a significant portion of the benefit seen with CFET devices.

Options have been posed to combine lower in-situ doping in conjunction with heavy implantation of the source and drain contacts followed by recrystallization of the metal-dopant alloy. These processes, however, require laser anneals of temperatures exceeding 1300° C. for short durations. Although heating for only nanoseconds, the thermal spread into the lower tier devices is not insignificant and thermal simulations show that the corresponding temperature profile in the bottom tier device would exceed the 550° C. threshold for durations upward of several milliseconds. Likewise, the monolithic integrations of CFET can use a number of processes which are still in development and, as such, not currently available for high volume manufacturing enablement. These include the selective deposition of the entire HKMG module while maintaining consistent work function and threshold voltage requirements that are currently achieved with advanced CVD or ALD processing.

For sequential CFET integrations where one device and transistor is formed on the bottom tier and then a subsequent device and transistor pair is formed on an upper tier, the thermal implications can be similar. In this case, the formation of the upper device and contacts can drive thermal energy down not only to the device on a lower tier, but to a fully working transistor as well. Several options for sequential CFET enablement have been posed to avoid these thermal issues. Options include increasing the NMOS/PMOS separation, which results in significantly longer vias that need to connect from the M0 signal tracks down to the lower tier devices and gates. Also, incorporation of heat shields such as AlN or diamond-like carbon within the NMOS/PMOS separation is an option. However, thermal simulations show that such heat shields require excessive thickness as well and offer little advantage.

Other approaches can include the replacement of the PMOS device from an incorporating silicon nanosheet to one where the channel and contacts include germanium which do allow for significantly lower temperatures, but come with the risk of not intersecting with current industry roadmaps on high volume manufacturing. CFET is currently on a number of industry wide technology roadmaps, with many technology solutions still needed.

Techniques herein disclose process integration methods as well as several hardware solutions that enable a functioning, high-volume process for CFET devices while using high-temperature unit processes. This can be achieved through the incorporation of multiple wafer bonding to carrier wafers and wafer flips to allow access to the CFET backside such that a FINFET or GAA-like process flow can be incorporated into a CFET device. As was stated earlier, typical thermal-aware FINFET or GAA flows have not been incorporated into CFET devices as the lower tier devices and transistors are generally not accessible as the upper tier devices and transistors are being created, so higher temperature processes on upper tier devices generally have the risk of significantly degrading the bottom tier device and transistor. The wafer backside does provide access to lower-tier devices and transistors, even as the upper tier devices are still in the process of being formed. This allows process integrations in which high temperature processing can be maintained in an order consistent with FINFET and GAA processing.

FIG. 3 shows a table comparing a 2-dimensional (2D) GAA flow to a sequential CFET flow and also to techniques described herein, according to an embodiment of the present disclosure. The process flow shows how the thermal conflicts of the sequential CFET device can be removed through the incorporation of the wafer bonding and wafer flip processes. Techniques herein include adding an epi stack wafer bonding method to the sequential CFET process. The column on the right goes into more detail on the wafer bonding and flipping.

Comparing the three process integration flows, it is evident that the 2D GAA process integration follows a HKMG-last approach in which the metal gate is formed after all of the high thermal processes are completed in the FEOL and MOL. The limitation of these devices is that the scaling path for these devices stops by the time 4-track cell heights are brought into high volume manufacturing (which can include the adoption of back-side power delivery). A common approach to CFET such as sequential CFET allows for the typical HKMG-last approach for individual device/transistor tiers. Once a tier is completed, a new epitaxy stack wafer herein is bonded to the existing tier and the next device/transistor pair is formed using the same high-temperature processes which were used for the bottom tier device and transistor.

Techniques herein enable using many conventional 2D GAA or FINFET process integration in a flow for creating 3D (vertical stacks of devices) in terms of a valid "thermal" process sequence in which no temperature critical materials are deposited until all of the high thermal processes are completed across both or multiple device/transistor tiers. Such processes are realized with steps of bonding a wafer to a new carrier wafer and flipping the wafer to provide access to either NMOS or PMOS to allow the thermally compliant process integration. Accordingly, techniques herein can follow a sequential CFET flow without incurring thermal threshold related issues. For example, the NMOS gate can have interface layer growth, high-k deposition, and TiN cap 1410 deposition before being filled with a temporary material. The wafer is then bonded and flipped, and then the same/similar fabrication steps are executed on the complementary transistor. This enables a single-time (once performed) reliability anneal before completing the work function metal (WFM) and metal fill depositions of the complementary transistor, again bonding and flipping the wafer and performing the NMOS WFM deposition and metal fill. This enables reliability anneal processes being used and provides a much easier transition path for integrated circuit (IC) manufacturers from extending technology nodes consisting of GAA technology to those using stacked complementary devices such as CFET. As can be appreciated, many alternatives and applications are available to wafer bonding and flipping techniques herein. For convenience in describing embodiments herein, the description will focus on an integration format for a CFET device.

Referring now to the figures, FIG. 4 is a cross-sectional substrate segment including deposited layers, according to an embodiment of the present disclosure. In an embodiment, a first layer stack 400 is formed on a first wafer 405. As illustrated in FIG. 4, the first layer stack 400 can include a sub-isolation layer 410, a first epi 415, and a second epi 420. Reference to an epi material can be understood to mean an epitaxial material, such as one formed via a growth process. For example, on the first wafer 405, a layer of SiGe(65) can be grown by epitaxy as the sub-isolation layer 410, and alternating layers of SiGe(35) for the first epi 415 and silicon (such as single-crystal silicon) for the second epi 420 can be also grown by epitaxy. This example includes two layers of the silicon (i.e. the second epi 420) between, and separated by, layers of the SiGe(35) (i.e. the first epi 415). It may be appreciated that other materials can be used and any number of layers can be formed.

FIG. 5 is a cross-sectional substrate segment of two layer stacks bonded, according to an embodiment of the present disclosure. In an embodiment, a second wafer can be formed with a second layer stack 500. The second layer stack 500 can be similar, identical, or different to the first layer stack 400. In this example, the second layer stack 500 on the second wafer is identical and includes the sub-isolation layer 410, the first epi 415, and the second epi 420 in an identical arrangement. The first wafer 405 and the second wafer can then be bonded together along the layer stacks using a bonding dielectric 599, such as silicon oxide, disposed between the first layer stack 400 and the second layer stack 500. Such bonding processes can be realized using bonding tools and processes known in the art. For example, the bonding dielectric 599 can be deposited on the first layer stack 400 and the second layer stack 500 can be attached to the bonding dielectric 599 along a side of the bonding dielectric 599 opposite the first layer stack 400. A thickness of the bonding dielectric 599 can be well maintained in the bonding process and can be used at the primary vertical NMOS-PMOS separation for the CFET device. The wafer bonding process may not induce any additional wafer distortion effects and any potential unknown causes of any wafer distortion can be corrected by hardware, which can be used to measure the distortion and provide corrections at the subsequent lithography processing steps in the device integration.

In an embodiment, the upper/top carrier wafer (i.e. the first wafer 405, as shown in FIG. 5) can be removed, for example ground down, to remove bulk silicon to the surface of the higher germanium content sub-isolation layer 410, or the SiGe(65) epitaxy film that acts as an etch-stop layer. Thus, one side of the bonded wafer sandwich has bulk wafer material removed until reaching the layer stack on the respective side. The sub-isolation layer 410, or the SiGe(65) epitaxy film, can then be selectively removed from the adjacent layer of the first epi 415 material, or the SiGe(35) surface as shown in FIG. 5, for example via an etch process.

Figure 6:
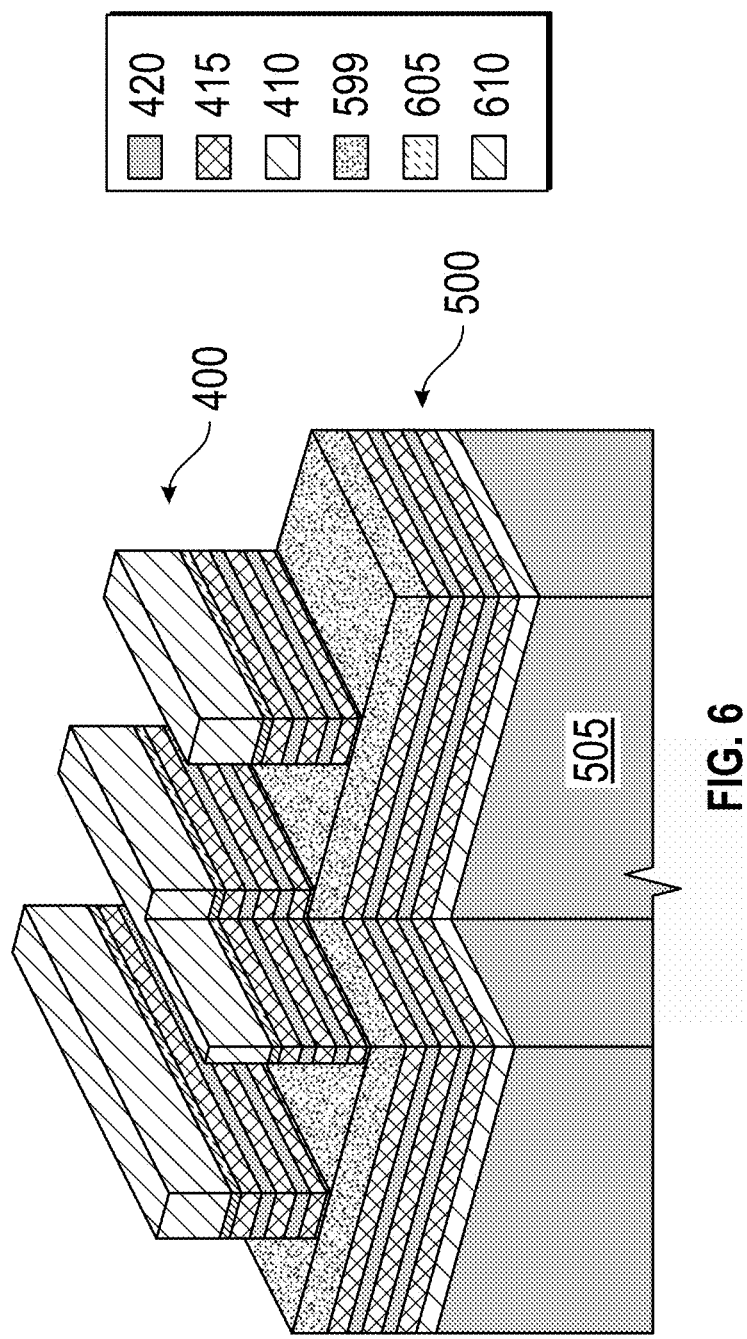
FIG. 6 is a cross-sectional substrate segment including a patterned device, according to an embodiment of the present disclosure.

A nanosheet active device can be patterned into the upper first layer stack 400 of Si/SiGe(35) epitaxial layers. To this end, FIG. 6 is a cross-sectional substrate segment including a patterned device, according to an embodiment of the present disclosure. Because the combined wafer sandwich will be flipped multiple times in the process integration, terms such as "bottom" or "top" are less clear with a working surface on both sides. Therefore, the description herein will label one device/side as "PMOS" and the compliment as "NMOS" to identify each surface/side. In an embodiment, the upper first layer stack 400 device can be PMOS, but it may be appreciated that this can be completely interchangeable based on what device is to be desired to be fabricated first. That is, the upper first layer stack 400 device can be "NMOS" if an NMOS device is to be fabricated before a PMOS device. However, the first layer stack 400 will be regarded as PMOS for the purposes of the following description. The first layer stack 400 can include a pad oxide 605 disposed overtop the first epi 415 furthest from the bonding dielectric 599 and a first (gate) cap 610 disposed overtop the pad oxide 605. The pad oxide 605 can be, for example, silicon dioxide ($SiO_2$), and the first cap 610 can be, for example, silicon nitride-based (e.g. SiN or $Si_3N_4$). The patterned first epi 415 and the second epi 420 can form a fin.

FIG. 7 is a cross-sectional substrate segment including a dummy gate, according to an embodiment of the present disclosure. In an embodiment, the dummy gate for the PMOS first layer stack 400 can be formed using GAA processing technologies and include a fin liner 705, amorphous silicon 710 disposed overtop the fin liner 705, and a second cap 715 disposed overtop the amorphous silicon 710 (for the orientation shown in FIG. 7). The fin liner 705 can be, for example, SiO. The number of silicon nanosheets can also be changed based on desired drive current for the resulting device. Likewise, sheet width can be adjusted in order to achieve a desired drive current for the resulting device. In the example, two silicon sheets are used for PMOS in the first layer stack 400 and two silicon sheets for NMOS in the second layer stack 500. Likewise, the composition of the channel material can also be changed. For example, if there is a desire to incorporate SiGe for PMOS, this can be realized by replacing the SiGe(35) (the first epi 415) and the silicon (the second epi 420) in this particular tier. The benefit of the method described herein is that any processing done for one transistor (e.g. the upper first layer stack 400) will not impact the opposite transistor (e.g. the lower second layer stack 500) because the first layer stack 400 and the second layer stack 500 exist on independent tiers (opposite sides of the bonded wafer, such as the "upper" tier and the "lower" tier) separated by the bonding dielectric 599.

Figure 8:
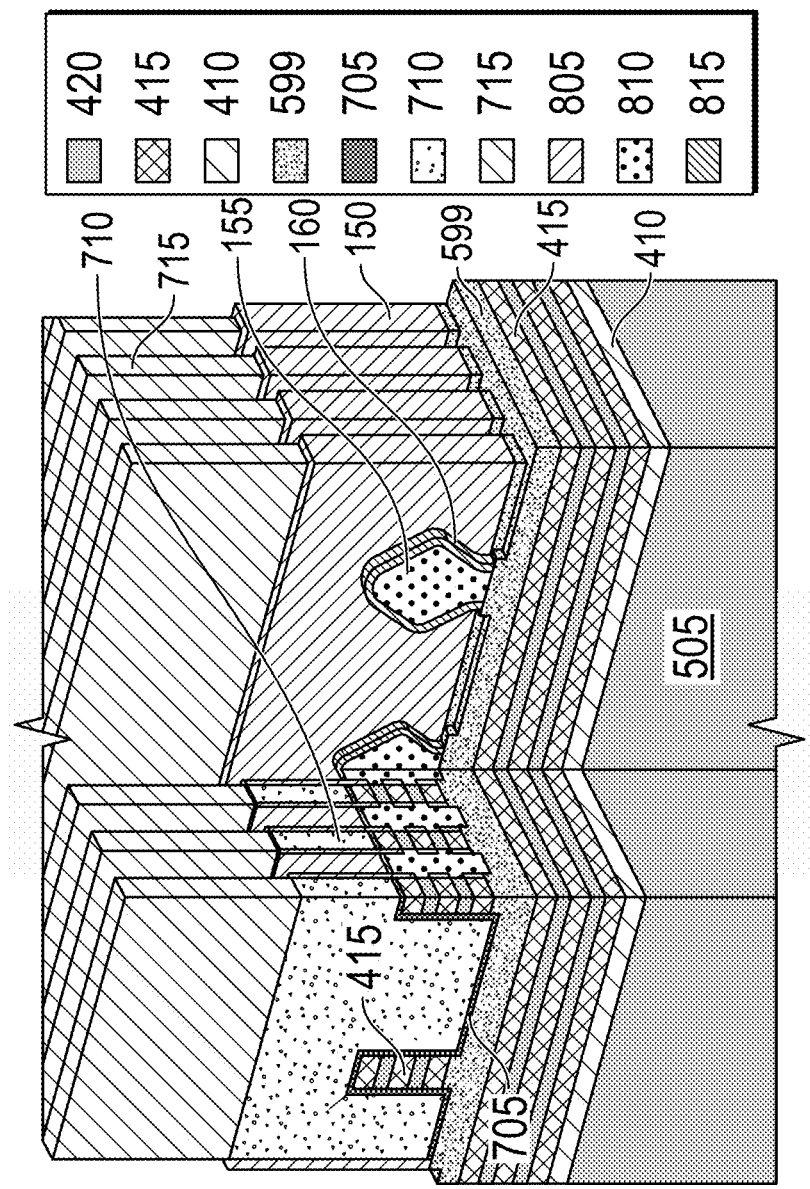
FIG. 8 is a cross-sectional substrate segment including the inner spacer, according to an embodiment of the present disclosure.

In an embodiment, an inner spacer can be formed on the dummy gate of the first layer stack 400. To this end, FIG. 8 is a cross-sectional substrate segment including the inner spacer, according to an embodiment of the present disclosure. For example, a low-k spacer 805 can be formed around the amorphous silicon 710. After the formation of the inner spacer, a channel, such as a silicon channel, can be recessed within the inner spacer to form any desired gate overlap distance.

The benefit of this process integration is that the contact can be in-situ doped at the E21 atom/cm$^2$ concentrations using higher temperature processes with or without any additional implantation into the top of the S/D contact. For example, the contact can be doped with boron to yield material SiGe:B 810. The contact can be capped with a contact etch stop layer (CESL) 815 formed from a nitride or SiCN layer and the contact bar area can be filled in with a pre-metallization dielectric (PMD) 905, such silicon oxide (see FIG. 9).

Figure 9:
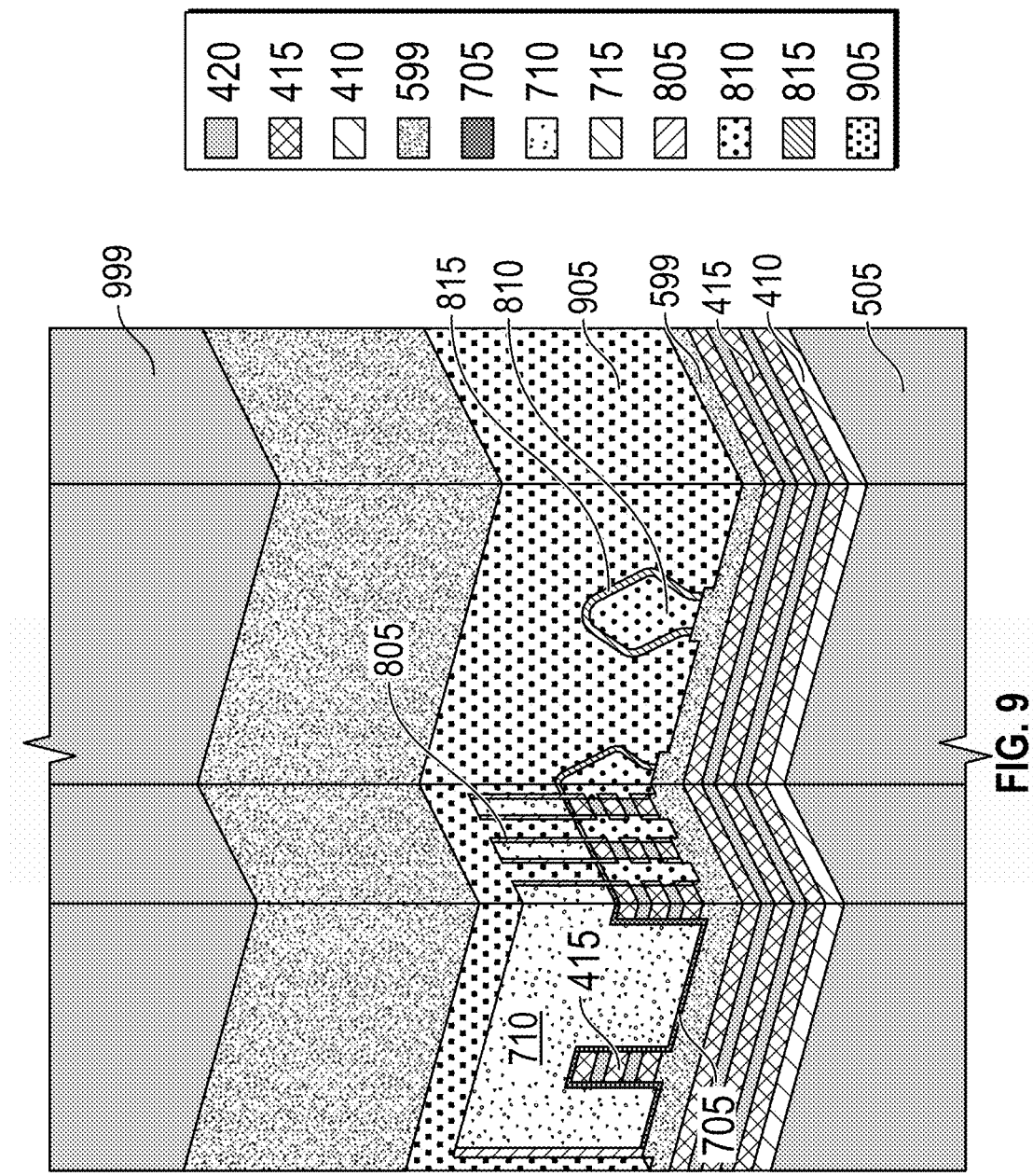
FIG. 9 is a cross-sectional substrate segment including a wafer bonded to the first layer stack, according to an embodiment of the present disclosure.

FIG. 9 is a cross-sectional substrate segment including a wafer bonded to the first layer stack 400, according to an embodiment of the present disclosure. In an embodiment, a new carrier wafer 999 can be bonded to the top of the existing stack of devices via more of the bonding dielectric 599 formed overtop the PMD 905 (relative to the orientation of FIG. 9). The combined wafer sandwich can be flipped to access the complementary side. For example, flipping the structure of FIG. 9 can allow access to the NMOS second layer stack 500.

Prior to the bonding of the carrier wafer 999 and dielectric fill, it may be appreciated that typically an epitaxial growth on would proceed after the formation of the dummy gate and inner spacer. This would include high temperature processing at sustained lengths of time. For a completed device, for example if the NMOS second layer stack 500 were already completed, this high temperature growth could introduce thermal violations for some features of the NMOS second layer stack 500 device. Therefore, by stopping the fabrication of the PMOS first layer stack 400 at this point and processing the NMOS second layer stack 500 on the opposite side up to the same fabrication step, the high temperature growth can be performed on both devices at the same time before either device has incorporated thermally-sensitive features and materials.

Figure 10:
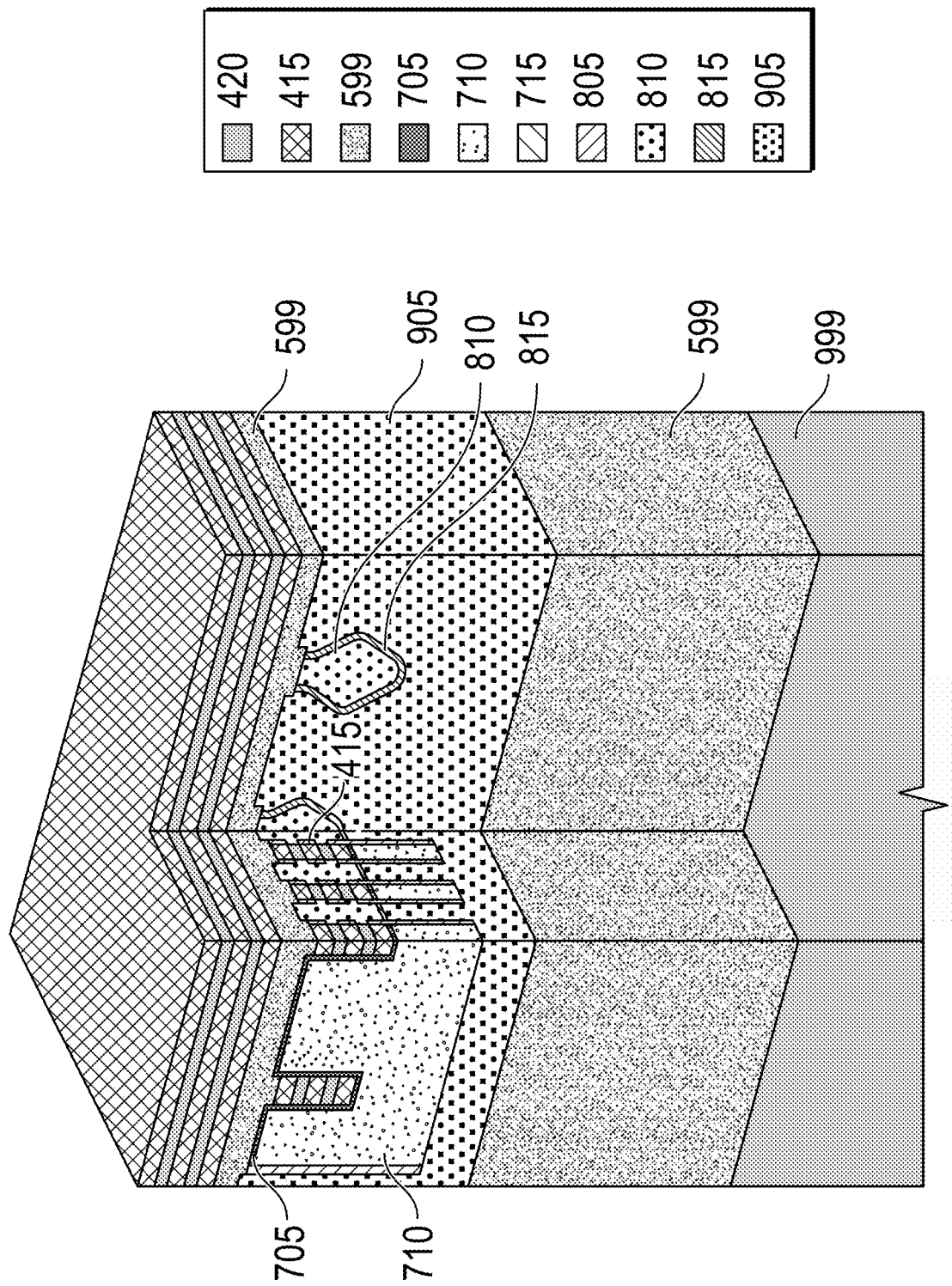
FIG. 10 is a cross-sectional substrate segment with the second layer stack uncovered, according to an embodiment of the present disclosure.

FIG. 10 is a cross-sectional substrate segment with the second layer stack 500 uncovered, according to an embodiment of the present disclosure. In an embodiment, the bulk silicon of the carrier wafer 999 can be ground down and the remainder removed with a silicon etch process where the SiGe(65) sub-isolation layer 410 can act as a sacrificial etch stop. The remaining SiGe(65) of the sub-isolation layer 410 can be removed until reaching the SiGe(35) of the first epi 415 underneath by means of a selective etch process.

Figure 11:
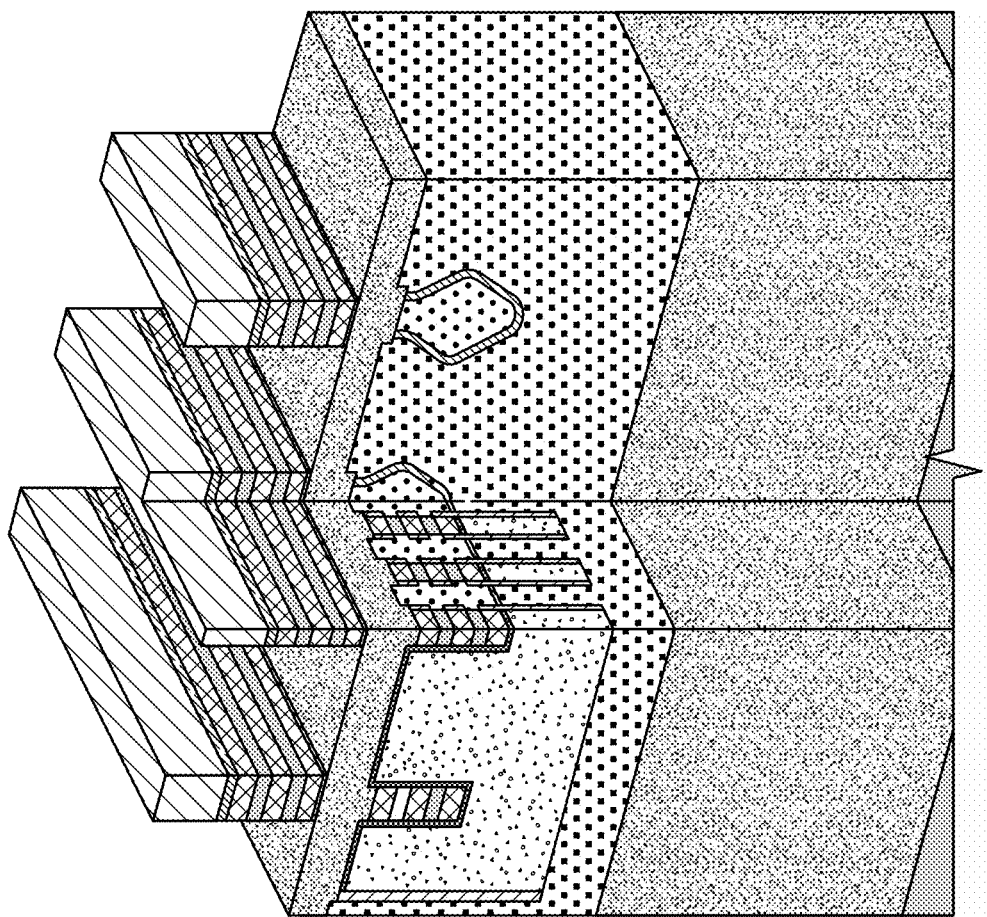
FIG. 11 is a cross-sectional substrate segment with the second layer stack uncovered and the second layer stack device patterned, according to an embodiment of the present disclosure.

FIG. 11 is a cross-sectional substrate segment with the second layer stack 500 uncovered and the second layer stack 500 device patterned, according to an embodiment of the present disclosure. The NMOS second layer stack 500 active device can be formed similar to that of the PMOS first layer stack 400 device described above. With this type of integration, the NMOS second layer stack 500 sheet widths, number of sheets, or even lateral spacing between the sheets can optionally be different than for the complementary device below (i.e. the PMOS first layer stack 400 on the opposite side).

The NMOS second layer stack 500 dummy gate can be formed, similar to the process used for the PMOS first layer stack 400 dummy gate, which again is still present on the opposite side. The NMOS second layer stack 500 dummy gate can also include the fin liner 705, the amorphous silicon 710 disposed overtop the fin liner 705, and the second cap 715 disposed overtop the amorphous silicon 710.

The NMOS second layer stack 500 inner spacer can be formed, similar to the process used for the PMOS first layer stack 400 inner spacer. In this instance, if there was a desire for the complementary devices to use different channel materials, the nanosheet recessing in the inner spacer process would be the opposite, where forming the inner spacer cavity the SiGe(35) of the first epi 415 can be recessed selectively to the silicon of the second epi 420. In the final inner spacer, the silicon of the second epi 420 can be recessed within the inner spacer to form the gate overlap region. The opposite to generate a SiGe(35) nanosheet would include a selective lateral recess of silicon selective to SiGe(35) to form the inner spacer cavity and the final inner-spacer recess would be done directly on the SiGe(35) channel.

Figure 12:
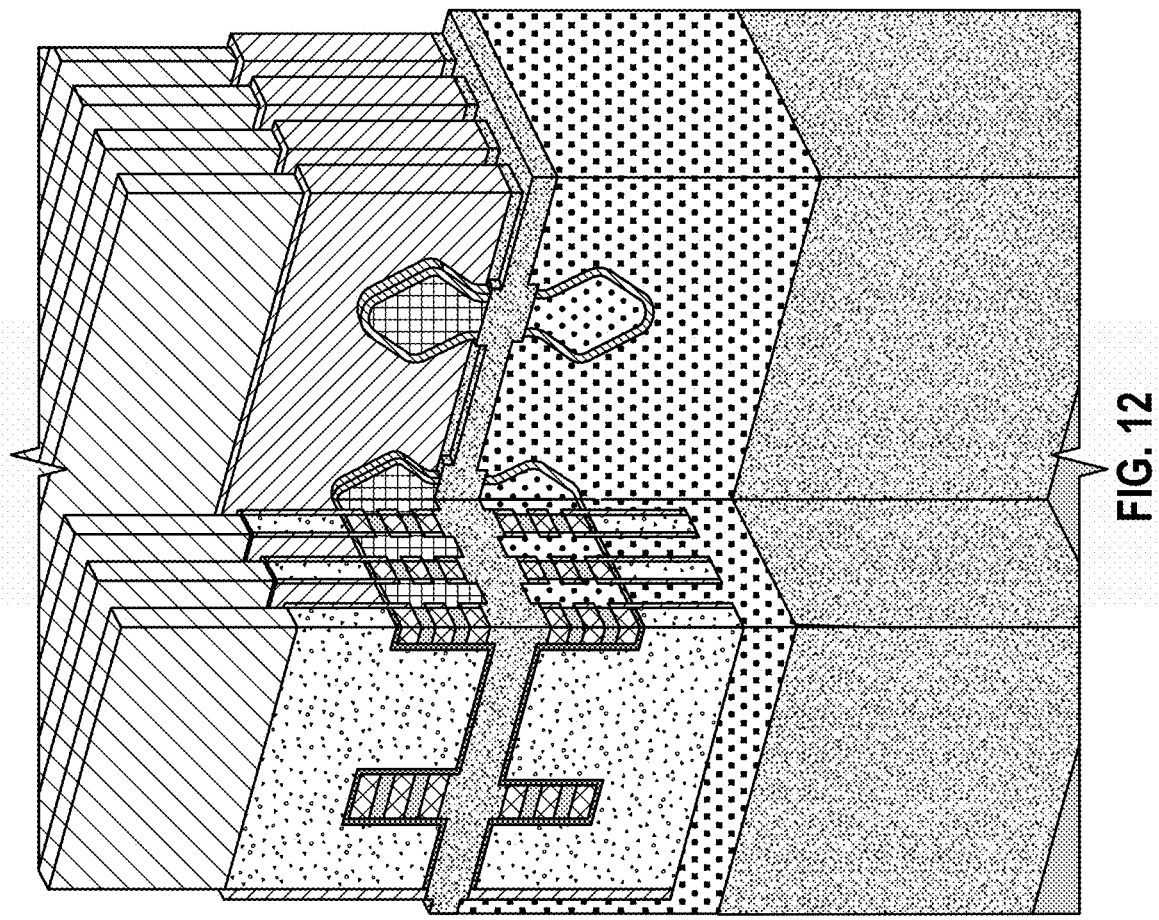
FIG. 12 is a cross-sectional substrate segment of the second layer stack with the formed source and drain contacts, according to an embodiment of the present disclosure.

The NMOS second layer stack 500 source and drain contact can be formed and capped with the CESL 815 liner. Per the aforementioned, FIG. 12 is a cross-sectional substrate segment of the second layer stack 500 with the formed source and drain contacts, according to an embodiment of the present disclosure. In an embodiment, as shown, the silicon has been doped with phosphorous to yield material Si:P 1205.

Figure 13:
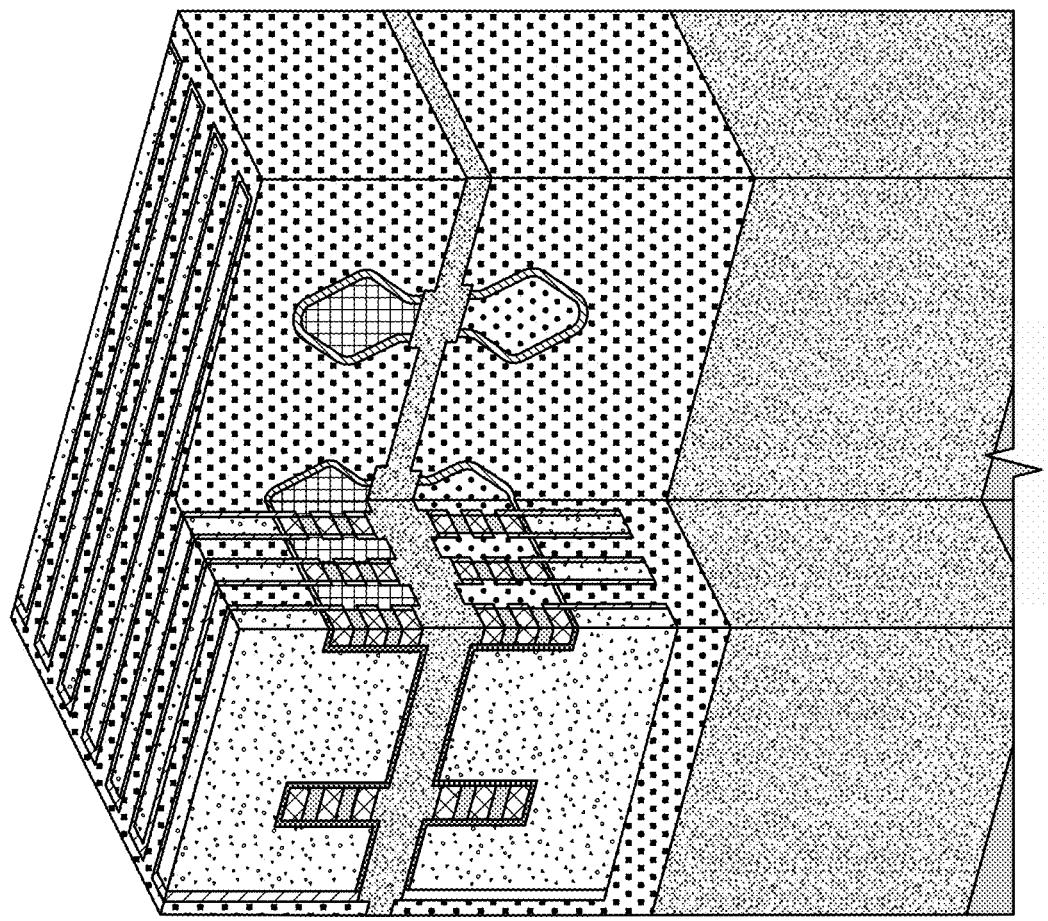
FIG. 13 is a cross-sectional substrate segment with dielectric fill, according to an embodiment of the present disclosure.

FIG. 13 is a cross-sectional substrate segment with dielectric fill, according to an embodiment of the present disclosure. In an embodiment, more of the PMD 905, such as silicon oxide, can be deposited within the contact bar region. The second layer stack 500 can be subject to a chemical mechanical polish (CMP) and the second cap 715 over the second layer stack 500 dummy gate can be removed in order to access the polysilicon or amorphous silicon 710 fill of the dummy gate structure.

FIG. 14 is a cross-sectional substrate segment of the second layer stack 500 with the amorphous silicon 710 removed, according to an embodiment of the present disclosure. In an embodiment, the polysilicon or amorphous silicon 710 dummy gate material can be removed to expose the protected fin of the first epi 415 and the second epi 420. The oxide fin liner 705 protecting the fin can be removed without removing material from the adjacent low-k spacer 805 by means of, for example, a direction-selective etch process. Once the fin liner 705 is removed, the silicon nanosheets can be released through selective etching of the SiGe(35) of the first epi 415. The silicon nanosheets can be rounded through incorporation of hydrogen plasma as well (as shown).

To maintain thermal compliance (e.g. for a high-k anneal), the NMOS second layer stack 500 nanosheet replacement metal gate (RMG) process can be separated into two steps. In one step, a first processed gate can have interface oxide layer growth, deposition of a high-k 1405, and deposition of a TiN cap 1410, and can be re-filled in with a replacement fill 1505 so that the complementary transistor can be processed to the same step. A reliability anneal can be used after the TiN cap 1410 deposition on the complementary gate so that no temperature-sensitive work function metals are exposed to the reliability anneal. This can help remove charge traps. Furthermore, a reactivation anneal can be performed after for the source and drains, as long as the duration is short and the temperature is less than 1000° C.

Figure 15:
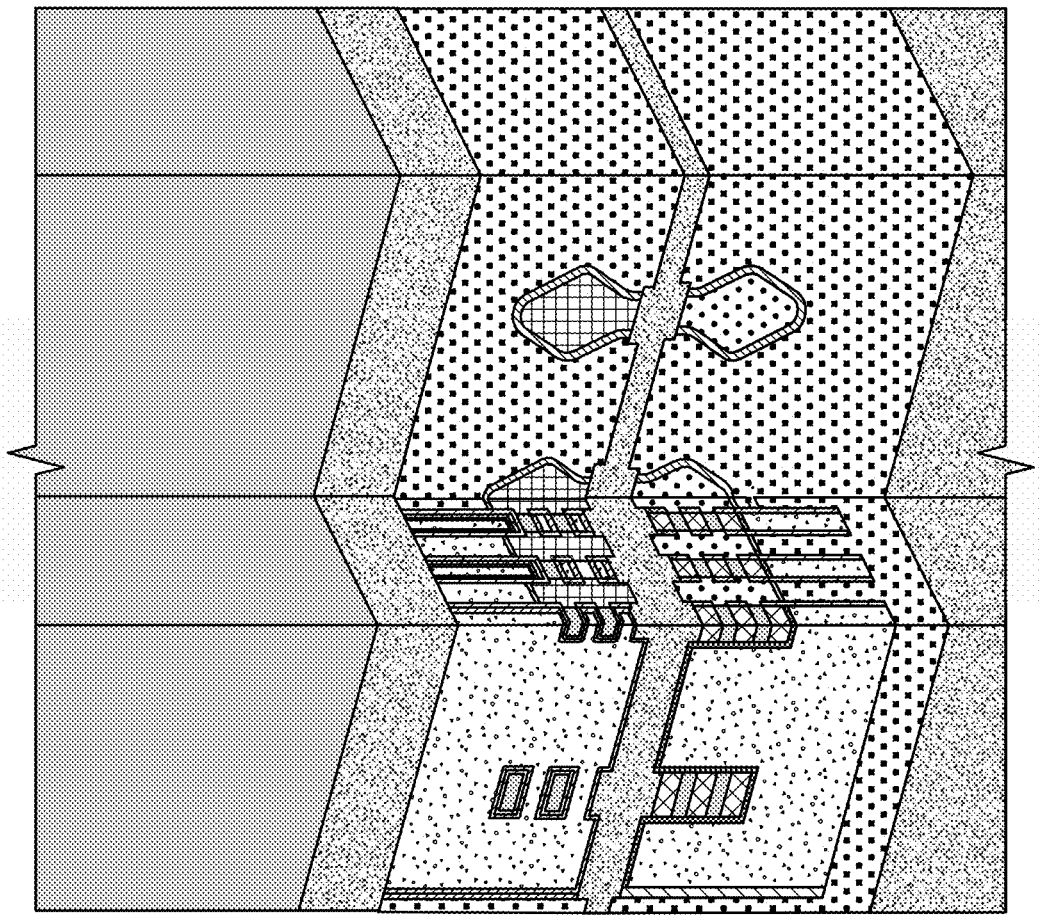
FIG. 15 is a cross-sectional substrate segment of the second layer stack filled and bonded to the carrier wafer, according to an embodiment of the present disclosure.

FIG. 15 is a cross-sectional substrate segment of the second layer stack 500 filled and bonded to the carrier wafer 999, according to an embodiment of the present disclosure. The second layer stack 500 can be filled with the replacement fill 1505 and a CMP can be performed to planarize the replacement fill 1505 material. The second layer stack 500 can be bonded to the carrier wafer 999 on the PMOS side and NMOS side can be targeted next for processing. In such a manner, the PMOS side has now advanced beyond the processing point of the NMOS side, and the NMOS side can be progressed to the same processing point of the PMOS side.

FIG. 16 is a cross-sectional substrate segment of the first layer stack 400 exposed after removing the carrier wafer 999, according to an embodiment of the present disclosure. In an embodiment, the wafer sandwich is flipped in order to provide access to the PMOS first layer stack 400 dummy gate. Again, the wafer sandwich need not actually be rotated to perform processing of the PMOS side, but for clarify of the figures, the structure is shown as rotated to dispose the actively processed structure as the upper device. The carrier wafer 999 can be removed and the PMD 905 around the first layer stack 400 can be polished and etched to expose the first layer stack 400 dummy gate. The polysilicon or amorphous silicon 710 can be removed, the silicon oxide fine liner can be removed, and the SiGe(35) of the first epi 415 can be selectively etched away to release the nanosheets including the silicon of the second epi 420. The nanosheets can then be rounded similar to the process that was done for the complementary nanosheets on the opposite side.

The interface oxide layer can be grown on the PMOS channel, followed by deposition of the high-k 1405 and the TiN cap 1410. At this point, the reliability anneal can be done without any negative impact as there are no work function metals yet deposited on the gate of either the first layer stack 400 or the second layer stack 500.

Figure 17:
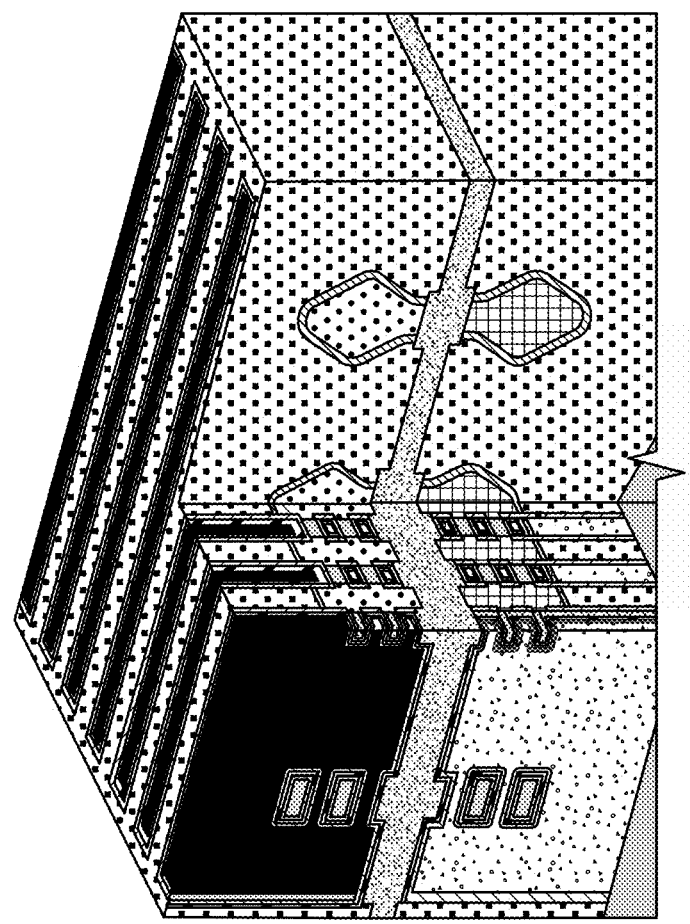
FIG. 17 is a cross-sectional substrate segment of the first layer stack with metal fill, according to an embodiment of the present disclosure.

FIG. 17 is a cross-sectional substrate segment of the first layer stack 400 with metal fill, according to an embodiment of the present disclosure. The PMOS RMG process can be completed with work function metal 1705 deposition, threshold voltage (Vt) tuning adjustments, and final liner and RMG metal fill 1710 into the final HKMG. For example, the RMG metal fill 1710 can be tungsten.

FIG. 18 is a cross-sectional substrate segment of the first layer stack 400 with gate cutting, according to an embodiment of the present disclosure. In an embodiment, gate cutting can be performed using a HKMG-cut last approach to allow for the deposition of the HKMG stack materials without driving any area scaling penalty. Another option is to use selective deposition for part or all of the HKMG stack. The cut last approach can be useful when the HKMG is formed by CVD/ALD methods.

Figure 19:
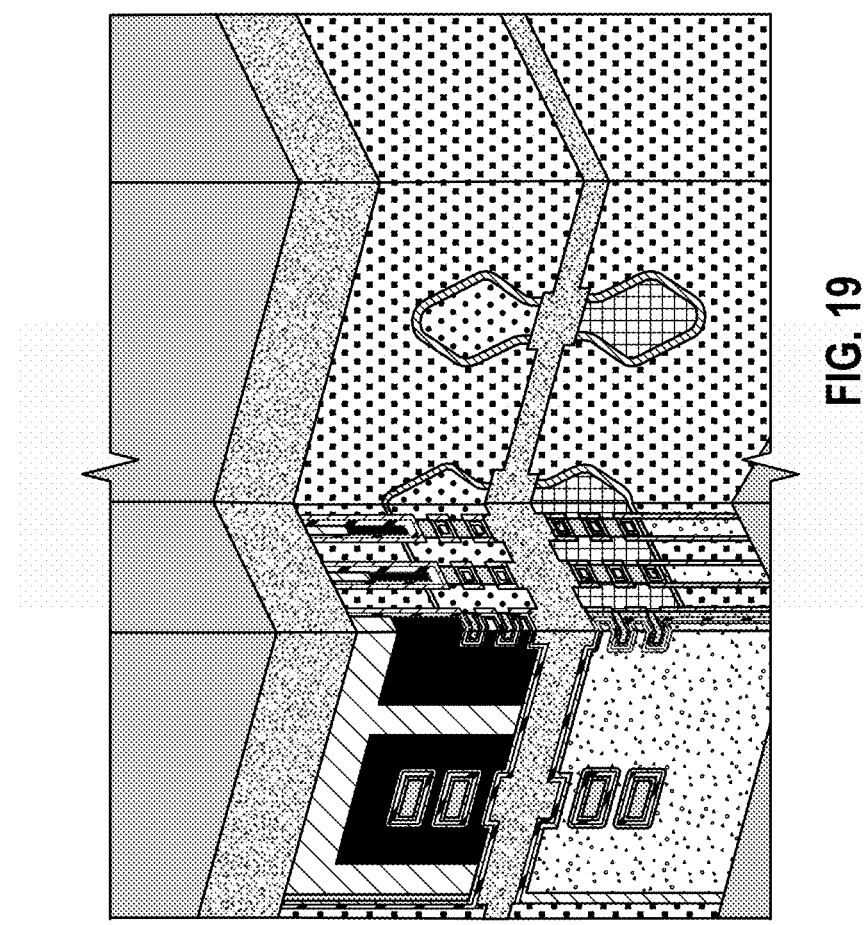
FIG. 19 is a cross-sectional substrate segment of the first layer stack with a third cap of SiN, according to an embodiment of the present disclosure.

FIG. 19 is a cross-sectional substrate segment of the first layer stack 400 with a third cap of SiN, according to an embodiment of the present disclosure. With the carrier wafer 999 used, the combined wafer sandwich can be flipped as needed and processed using existing wafer fabrication tools. In an embodiment, the PMOS first layer stack 400 metal gate can be recessed and a SiN cap 1805 placed overtop. This can be repeated for the NMOS second layer stack 500 gate with access from the opposite side. This can be important if the need for dual M0 metal is required for both "top-side" and "bottom-side" access. The SiN cap 1805 can be etch-selective to the SiC(N) cap that will be placed over the interconnect metal to provide for self-alignment in the eventual via connections to the gate or source and drain from the M0 signal tracks. As shown in FIG. 19, the first layer stack 400 can be bonded to the carrier wafer 999 again.

Figure 20:
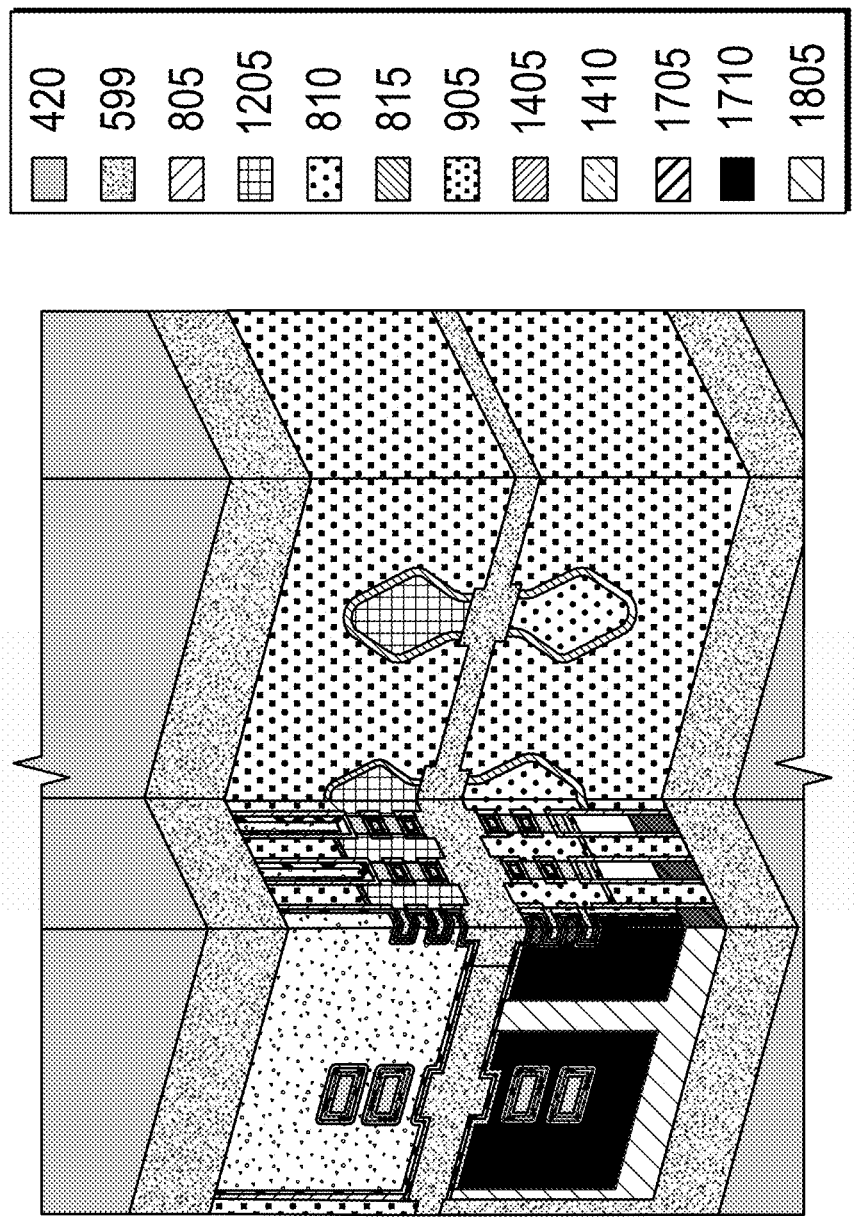
FIG. 20 is a cross-sectional substrate segment of the wafer sandwich flipped for access to the NMOS second layer stack, according to an embodiment of the present disclosure.

FIG. 20 is a cross-sectional substrate segment of the wafer sandwich flipped for access to the NMOS second layer stack 500, according to an embodiment of the present disclosure. The wafer sandwich can be flipped over in order to provide access to the uncompleted (but through high-k anneal) gate of the NMOS second layer stack 500.

FIG. 21 is a cross-sectional substrate segment of the second layer stack 500 uncovered, according to an embodiment of the present disclosure. In an embodiment, the NMOS gate replacement fill 1505 material can be removed to expose the TiN cap 1410 overtop the gate and the channels. The NMOS second layer stack 500 gate is finished with deposition of final work function metals 1705.

FIG. 22 is a cross-sectional substrate segment of the second layer stack 500 with common gates formed, according to an embodiment of the present disclosure. Before final metal fill, a common NMOS/PMOS gate can be formed through the patterned etch of inter-gate vias which will make direct connection to both gates. The vias can pass through the bonding dielectric 599 material and reach the complementary gate which has been finished and metalized before this point.

FIG. 23 is a cross-sectional substrate segment of the second layer stack 500 including the RMG metal fill 1710 and the SiN cap 1805, according to an embodiment of the present disclosure. In an embodiment, the NMOS second layer stack 500 gate can then be deposited with the liner and filled in with RMG metal fill 1710, such as tungsten. The inter-gate vias can be metalized as an all-in-one metallization step. TiN can optionally be deposited to adhere to the dielectric.

In an embodiment, the NMOS second layer stack 500 HKMG cut-last can also be used to fill in the gate cuts of the NMOS tier. Then, NMOS second layer stack 500 gate can be recessed and the SiN cap 1805 placed overtop the completed gate, as shown.

Figure 24:
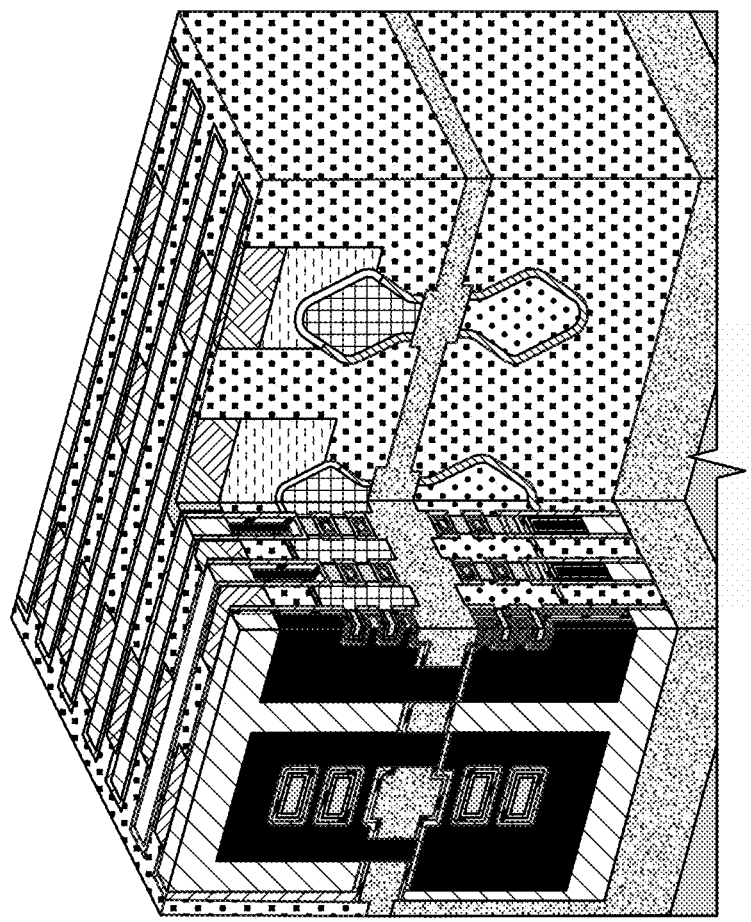
FIG. 24 is a cross-sectional substrate segment of the second layer stack including an NMOS interconnect, according to an embodiment of the present disclosure.

FIG. 24 is a cross-sectional substrate segment of the second layer stack 500 including an NMOS interconnect, according to an embodiment of the present disclosure. In an embodiment, the NMOS interconnect can be formed by etching an interconnect trench to the NMOS S/D contact, opening the CESL 815, growing a silicide 2405, and performing low temperature silicide 2405 anneal if required. This can be performed before filling in with a liner and a high conductive metal 2410 such as ruthenium or cobalt. The metal interconnect can be recessed and an etch selective interconnect cap 2415 can be deposited overtop, such as SiC or SiCN, in order to provide etch-based self-alignment for any gate and contact vias in what is commonly referred to as a self-aligned gate contact (SAGC) or contact-over-active-gate (COAG) process. The anneal for the high conductive metal 2410 (e.g., the ruthenium) can be performed at 450° C. Notably, this interconnect formation occurring later in the process after all high temperature processes have been completed for both devices presents a significant advantage.

The same processing can be performed on the PMOS first layer stack 400 to progress the processing to the same point for both devices. To this end, the second layer stack 500 is bonded to the carrier wafer 999 again and flipped in order to access the PMOS first layer stack 400.

FIG. 25 is a cross-sectional substrate segment of the first layer stack 400 including a hardmask, according to an embodiment of the present disclosure. In an embodiment, the carrier wafer 999 can be removed from the PMOS tier and any inter-interconnect vias can be formed to make inverted structures or connections between NMOS and PMOS source and drain. In this example, the inter-interconnect via is done through a dual-damascene process incorporating a memorized PMOS interconnect pattern in the hardmask, which can be formed from, for example, the TiN cap 1410 material.

FIG. 26 is a cross-sectional substrate segment of the first layer stack 400 including a PMOS interconnect, according to an embodiment of the present disclosure. In an embodiment, the PMOS interconnect can then be formed through etching down to the top surface of the PMOS contact, removing the CESL 815, growing the silicide 2405, and annealing the silicide 2405 (if needed). The inter-interconnect and PMOS interconnect can be metalized at the same time using the high conductive metal 2410, such as ruthenium or cobalt. The metal interconnect can be recessed in order to provide space for the etch selective interconnect cap 2415, such as SiC or SiCN.

FIG. 27 is a cross-sectional substrate segment of the first layer stack 400 and the second layer stack 500 including buried power rails, according to an embodiment of the present disclosure. In an embodiment, any buried power rail or connection to back-side power can be formed. For example, a hardmask can be placed on the first layer stack 400 overtop a large dielectric film and the buried power rail memorized into the hardmask. The vias connecting either of the contacts or even the optional M0 lines can be formed through a dual damascene process in conjunction with transferring the buried power into the dielectric. Because sizes of the vias will be significantly smaller compared to the buried power rail, a dual metallization scheme is enabled in which ruthenium or cobalt (with an added liner) can be deposited to fill in the via structures and provide a liner for the bulk buried power rail. After the metallization of the initial metal, the remainder of the buried power rail can be metallized with copper 2705 in order to provide better voltage (IR) drop for the given size compared to the metals used for the via metallization. The other benefit of this technique is that it can avoid formation of the buried power rail in the FEOL, which can be a concern for HVM implementation given the desire to have no metals present in any of the FEOL processing hardware in most high volume IC manufacturers. The first layer stack 400 can be bonded to the carrier wafer 999 and flipped over for continued processing. For a two-tier CFET flow, this can be the final flip of the wafer and continued wiring can be formed on one side.

FIG. 28 is a cross-sectional substrate segment of the first layer stack 400 and the second layer stack 500 including connections to gates and contacts, according to an embodiment of the present disclosure. In an embodiment, the method can continue with BEOL integrations where M0 tracks can make connection to the inter-tier gates and contacts.

Accordingly, techniques herein include methods for fabrication of a complementary FET (CFET) device in which all high temperature processes commonly used for FINFET and GAA technologies can be incorporated without degradation of temperature-sensitive materials within the device and transistors.

Some CFET devices are built through one of two methods, both of which provide limitations to current thermal processing which has been developed successfully for FINFET and GAA technologies currently in high volume production. Such CFET devices are comprised of monolithic integrations in which a common silicon/silicon germanium FIN is used to form the upper and lower tier device and transistor pairs. Such integrations enable a final HKMG-gate last process as is used for FINFET and GAA technologies, however in these integrations the device contacts are formed separately.

In a tier-on-tier approach to the current process integration of monolithic CFET devices, the lower tier contact requires the formation of the local interconnect which likewise requires the formation of a silicide between the epitaxy contact and the interconnect metal. Such silicide films are sensitive to the temperatures used for the growth of the in-situ doped contact on the upper device tiers.

The primary challenge with constructing monolithic CFET involves the stacking of complementary transistors overtop one another for the case where the stacked transistors are to be isolated from one another, as is common for multiple types of standard cells currently used in logic. Approaches are being developed for the enablement of split transistors for monolithic CFET implementation, but there are significant challenges for success. For example, one approach includes sequential CFET devices in which the lower tier device and transistor pair is formed followed by placement of new silicon and silicon germanium stack overtop the active tier by means of wafer bonding. Sequential processes with the bottom transistor already formed are even are thermally sensitive to the upper tier device formation process. Methods to reduce the thermal spread from the upper tier device and transistor pair during manufacture to the lower tier completed device and transistor pair have been theorized such as inclusion of larger separation distances or inclusion of thermal spreading materials in the NMOS/PMOS separation. However, thermal modelling has suggested that this separation needs to be significant, which can have a negative impact on the full device performance.

Accordingly, techniques herein include forming each device stack on separate wafers, bonding the wafers, and then using carrier wafer 999 to flip the combined wafer to selectively access each side. For example, a silicon substrate with grown alternating silicon and silicon germanium sheets commonly used for GAA technology where said wafer is bonded to another duplicate wafer in face-to-face fashion through the incorporation of a bonding dielectric 599. The bonding dielectric 599 is positioned at the NMOS/PMOS separation of the three-dimensional device. Alternating silicon and silicon germanium epitaxy film stacks on each face of the device serves as the starting FIN lattice for future channel release processing. Thus, the devices will have face-to-face alignment.

A substrate, for example a bulk silicon wafer, can be thinned down from which alternating stacks of silicon germanium and silicon can be epitaxially grown from both faces of the substrate. Note that PMOS/NMOS separation can be derived from the thickness of the remaining substrate and not from any bonding dielectric 599 used in the previous case. Such a method provides a mechanism to transfer strain to the resulting formed channels.

The wafer integration process can alternate from one wafer face to the other in a manner consistent such that high temperature processes can be done in sequence prior to the formation or deposition of any such materials which have critical temperature dependence. Examples of high temperature processes include: thermal anneals such as used for shallow trench oxide formation, high-k dielectric annealing, in-situ doped epitaxy growth processes used to form source and drain contacts, laser spike annealing used for dopant activation and reliability annealing, etc. Examples of materials which have thermal sensitivities include multiple work function metals such as TiAl, TiAlN, TiAlC, TiC, and silicide materials such as TiSi. Temperature sensitivities can be exhibited by phase change of materials or agglomeration of materials which can lead to device break-down at worse case, and threshold voltage variability at the least worse case.

The wafer processing sequence herein can approximate the thermal processing sequence developed for FINFET and GAA technologies in which the high temperature processes are done for both devices before the formation and/or deposition of the temperature sensitive materials. Maintaining such thermally sequenced processes for CFET is difficult given that access to the bottom-tier devices is effectively blocked when working on upper tier device and transistors. Thus, for common CFET applications, the lower tier device and transistors need to be completed, meaning that all temperature sensitive materials are present on the lower tier devices while the upper tiers are being manufactured. By enabling a thermal process sequence similar to that used for FINFET and GAA technology today, the method described herein greatly pulls in the production readiness of CFET devices since such unit processing steps do not need significant changes to be enabled on a CFET device.

The CFET thermally compliant integration allows for access to bottom tier and upper tier devices at will through wafer carrier bonding and subsequent wafer flipping to allow for access to both sides of the wafer and therefore both tiers of the devices. These techniques allow for a sequence to be completed on the PMOS or NMOS tiers up to the point where a thermally sensitive material will be introduced. Additionally, it allows the wafer to be flipped to the complementary side so that the same processing can be done up to the same point in which a thermally sensitive material will be formed or deposited. Therefore, a FINFET or GAA flow can be established for a CFET wafer by including the wafer bonding and flipping steps to provide access to both device and transistor tiers. This process can be repeated as often as needed in following a FINFET or GAA integration flow in which the devices and transistors are treated in side-by-side fashion which is not possible in CFET integrations. In this manner, the side-by-side process on the same wafer face is replaced by a wafer side-by-side process employing both faces of the wafer. Such CFET device with exclusive access to one wafer face and hence one device and transistor tier at a time allows for easier threshold adjustment tuning. Such a CFET device also provides equal access to both the "upper" and "lower" tiers where connections to signal tracks at M0 can be done from either side of the combined or bonded wafer.

Incorporation of any connection to backside power is now also more easily done in that incorporation of the buried power or MIV connection to back-side power delivery can now be done after HKMG processing where the presence of metals is usually strictly forbidden. For CFET devices, the incorporation of buried power rails was typically performed early in the FEOL before the HKMG formation. The buried power rails and subsequent vias connecting the buried power to the devices can now be done using a dual damascene approach in the formation of the buried power rail trench, thus giving the ability to do co-metallization of the buried power rail where the smaller via structures can be pre-filled with a high conductance material such as ruthenium or cobalt and where this deposition will simultaneously form a high quality liner within the buried power rail trench. The remainder of the buried power rail trench can be filled with copper to promote superior resistance. Typically the inclusion of copper in buried power rails would be prohibited if the rails were formed in the FEOL due to the high electro migration of copper in the presence of high thermal processing in the FEOL and MOL modules, as well as the restriction in using high mobility metals such as copper in the FEOL and MOL.

Figure 29:
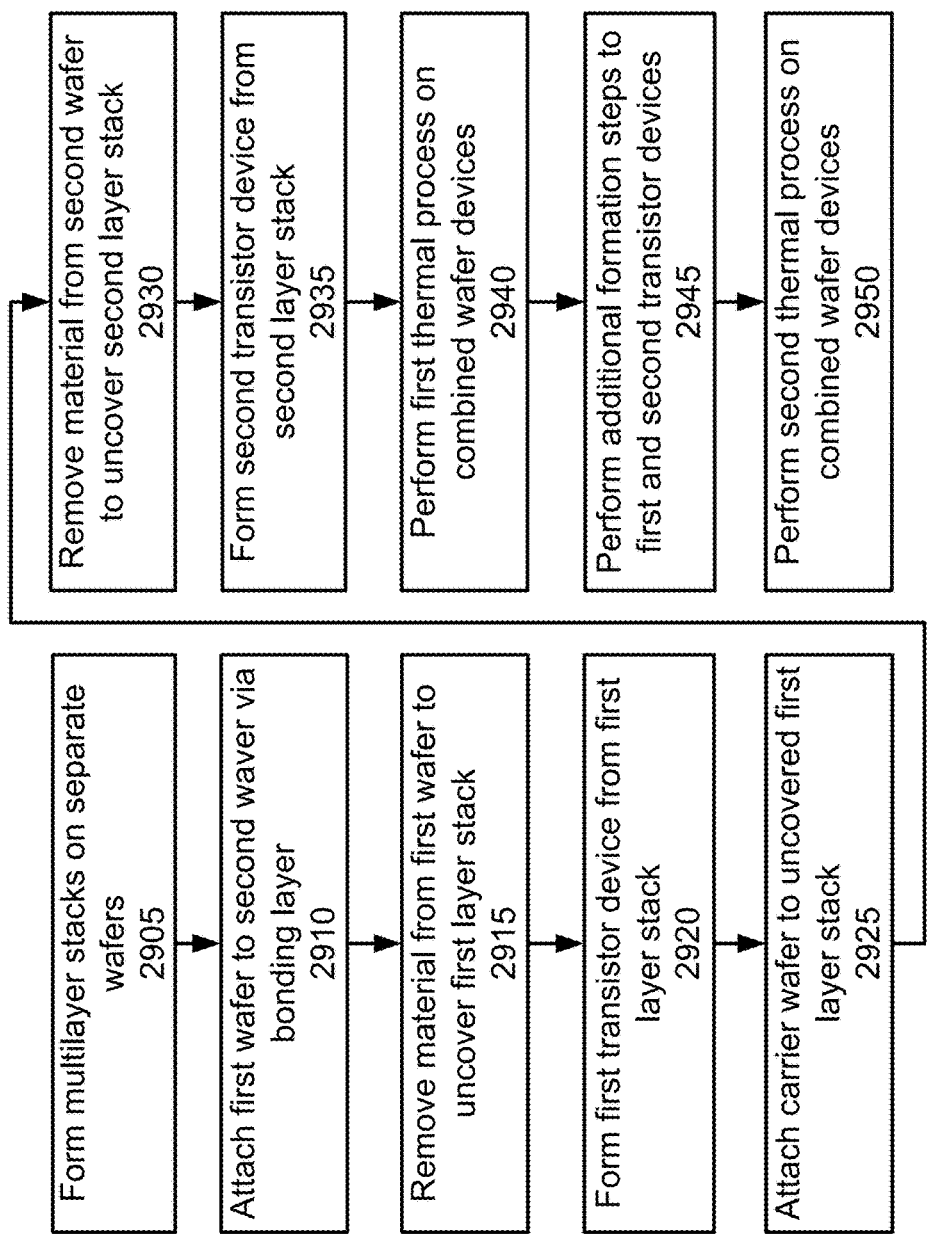
FIG. 29 is a flow chart for a method of fabricating a semiconductor device, according to an embodiment of the present disclosure.

FIG. 29 is a flow chart for a method 2900 of fabricating a semiconductor device, according to an embodiment of the present disclosure.

In step 2905, the first multilayer stack is formed on the first wafer 405 and the second multilayer stack is formed on the second wafer.

In step 2910, the first wafer 405 can be attached to the second wafer via a bonding layer disposed between the first multilayer stack and the second multilayer stack. For example, the bonding dielectric 599 can be deposited on the first multilayer stack and the second multilayer stack can be attached to the bonding dielectric 599 on an opposite side of the bonding dielectric 599 opposite the first multilayer stack.

In step 2915, material from a side of the first wafer 405 opposite the first layer stack 400 can be removed, for example via grinding or etching, to uncover and access the first layer stack 400.

In step 2920, a first transistor device can be formed at least partially from the uncovered first layer stack 400. For example, dummy gates and spacers can be formed.

In step 2925, the carrier wafer 999 can be attached to the uncovered first layer stack 400. For example, a dielectric fill and the bonding dielectric 599 can be deposited over the first layer stack 400 to attach to the carrier wafer 999.

In step 2930, material from a side of the second wafer opposite the second layer stack 500 can be removed to uncover and access the second layer stack 500.

In step 2935, a second transistor device can be formed at least partially from the uncovered second layer stack 500.

In step 2940, a first thermal process can be performed on the first transistor device and the second transistor device. For example, an anneal can be performed at a high temperature while not affecting any current materials in the first transistor device and the second transistor device.

In step 2945, additional transistor formation steps can be performed to further fabricate the first transistor device and the second transistor device. A myriad of examples are described above.

In step 2950, a second thermal process can be performed on the first transistor device and the second transistor device. It may be appreciated that additional thermal process steps can be performed hereafter provided the temperature thresholds of the incorporated materials in the first transistor device and the second transistor device are not exceeded for a long duration, or at all. In such a way, two transistor devices can be fabricated together on the same wafer without violating any thermal sensitivity of materials in either transistor device.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a semiconductor device, comprising:

forming a first layer stack on a first wafer;

forming a second layer stack on a second wafer, the second layer stack and the second wafer being separated from the first layer stack and the first wafer;

attaching the first layer stack to the second layer stack via a bonding layer disposed between the first layer stack and the second layer stack;

uncovering the first layer stack without uncovering the second layer stack, the first layer stack being uncovered along an uncovered side of the first layer stack opposite a bonded side of the first layer stack, the bonded side of the first layer stack being proximal to the bonding layer;

forming, at least partially, a first transistor device from the first layer stack;

attaching a first carrier wafer to the uncovered side of the first layer stack;

uncovering the second layer stack, the second layer stack being uncovered along an uncovered side of the second layer stack opposite a bonded side of the second layer stack, the bonded side of the second layer stack being proximal to the bonding layer;

forming, at least partially, a second transistor device from the second layer stack; and performing a first thermal process on the first transistor device and the second transistor device.

2. The method of claim 1, further comprising performing additional formation steps on the first transistor device and the second transistor device.

3. The method of claim 2, further comprising performing a second thermal process on the first transistor device and the second transistor device.

4. The method of claim 3, wherein the first thermal process is performed at a processing temperature greater than a processing temperature of the second thermal process.

5. The method of claim 2, further comprising repeating the steps of
attaching a carrier wafer to a target transistor device;
uncovering an untargeted transistor device opposite the target transistor device; and
performing additional formation steps on the target transistor device.

6. The method of claim 5, further comprising
upon the target transistor device and the untargeted transistor device reaching a same formation step, performing additional thermal processes on the target transistor device and the untargeted transistor device.

7. The method of claim 1, wherein forming the first transistor device includes forming a PMOS device, and forming the second transistor device includes forming a NMOS device.

8. The method of claim 7, further comprising connecting the PMOS device and the NMOS device to form a complementary field effect transistor.

9. The method of claim 1, wherein uncovering the first layer stack further comprises removing material from a second side of the first wafer opposite the first side of the first wafer to uncover the first layer stack.

10. The method of claim 1, wherein uncovering the second layer stack further comprises removing material from a second side of the second wafer opposite the first side of the second wafer to uncover the second layer stack.

11. The method of claim 1, wherein attaching the first carrier wafer to the uncovered side of the first layer stack further comprises
filling the uncovered first layer stack with a dielectric fill;
forming a bonding dielectric on the dielectric fill; and
attaching the first carrier wafer to the bonding dielectric.

12. The method of claim 1, wherein the bonding layer comprises a bonding dielectric material.

13. The method of claim 1, wherein the first layer stack includes an etch-stop layer disposed between the first layer stack and the first wafer, and the second layer stack includes the etch-stop layer disposed between the second layer stack and the second wafer.

14. The method of claim 13, wherein uncovering the first layer stack further comprises etching the first wafer until reaching the etch-stop layer, and selectively etching the etch-stop layer.

15. The method of claim 1, wherein a material of the first wafer and the second wafer is bulk silicon, and uncovering the first layer stack and the second layer stack further comprises removing the bulk silicon material from each wafer to access the respective layer stack.

16. A method of forming a complementary field effect transistor (CFET) device, comprising:
forming a first layer stack on a first wafer;
forming a second layer stack on a second wafer, the second layer stack and the second wafer being separated from the first layer stack and the first wafer;
attaching the first layer stack to the second layer stack via a bonding layer disposed between the first layer stack and the second layer stack;
stepwise accessing each layer stack from each respective side without uncovering the other layer stack at the same time to partially form transistor devices; and
performing a first thermal process on the partially formed transistor devices.

17. The method of claim 16, wherein stepwise accessing each layer stack further comprises removing wafer material from a given respective side of the combined layer stack while an opposite side of the combined layer stack is protected.

18. The method of claim 17, further comprising
continuing formation of the transistor devices via alternating access to each layer stack and bonding a carrier wafer to respective sides of the combined layer stack; and
performing a second thermal process on the transistor devices.

19. The method of claim 18, wherein the first thermal process is performed at a processing temperature greater than a processing temperature of the second thermal process.

20. The method of claim 16, wherein stepwise accessing each layer from each respective side to partially form transistor devices further comprises forming a PMOS device and forming a NMOS device.

* * * * *

UNITED STATES PATENT AND TRADEMARK OFFICE
CERTIFICATE OF CORRECTION

| | |
|---|---|
| PATENT NO. | : 11,764,113 B2 |
| APPLICATION NO. | : 17/392997 |
| DATED | : September 19, 2023 |
| INVENTOR(S) | : Smith et al. |

It is certified that error appears in the above-identified patent and that said Letters Patent is hereby corrected as shown below:

On the Title Page

Item (72), in "Inventor", Line 4, delete "Mechanicsville," and insert -- Mechanicville, --, therefor.

Signed and Sealed this
Thirteenth Day of February, 2024

*Katherine Kelly Vidal*

Katherine Kelly Vidal
*Director of the United States Patent and Trademark Office*